(12) United States Patent
Kim et al.

(10) Patent No.: US 11,749,614 B2
(45) Date of Patent: Sep. 5, 2023

(54) THROUGH-SILICON VIA (TSV) KEY FOR OVERLAY MEASUREMENT, AND SEMICONDUCTOR DEVICE AND SEMICONDUCTOR PACKAGE INCLUDING TSV KEY

(71) Applicant: SAMSUNG ELECTRONICS CO., LTD., Suwon-si (KR)

(72) Inventors: Yongyeop Kim, Daegu (KR); Seil Oh, Suwon-si (KR); Eunji Kim, Seoul (KR); Kwangwuk Park, Seoul (KR); Jihak Yu, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 121 days.

(21) Appl. No.: 17/340,445

(22) Filed: Jun. 7, 2021

(65) Prior Publication Data
US 2022/0139840 A1    May 5, 2022

(30) Foreign Application Priority Data
Nov. 5, 2020  (KR) .......................... 10-2020-0147096

(51) Int. Cl.
| | | |
|---|---|---|
| *H01L 23/544* | (2006.01) | |
| *H01L 25/065* | (2023.01) | |
| *H01L 23/48* | (2006.01) | |

(52) U.S. Cl.
CPC .......... *H01L 23/544* (2013.01); *H01L 23/481* (2013.01); *H01L 25/0657* (2013.01); *H01L 2223/54426* (2013.01); *H01L 2225/06513* (2013.01); *H01L 2225/06541* (2013.01);
(Continued)

(58) Field of Classification Search
CPC ............ H01L 2223/54426; H01L 2225/06541
See application file for complete search history.

(56) References Cited

U.S. PATENT DOCUMENTS

| 8,102,064 B2 | 1/2012 | Renn |
| 8,653,676 B2 | 2/2014 | Kim et al. |

(Continued)

FOREIGN PATENT DOCUMENTS

| CN | 103107146 A | 5/2013 |
| KR | 10-0468699 B1 | 4/2005 |

(Continued)

OTHER PUBLICATIONS

Taiwanese Office action dated Apr. 19, 2022.

*Primary Examiner* — Mamadou L Diallo
(74) *Attorney, Agent, or Firm* — Lee IP Law, P.C.

(57) ABSTRACT

A through-silicon via (TSV) key for overlay measurement includes: a first TSV extending through at least a portion of a substrate in a first direction that is perpendicular to a top surface of the substrate; and at least one ring pattern, which is apart from and surrounds the first TSV in a second direction that is parallel to the top surface of the substrate, the at least one ring pattern being arranged in a layer that is lower than a top surface of the first TSV in the first direction, wherein an inner measurement point corresponds to the first TSV, an outer measurement point corresponds to the at least one ring pattern, and the inner measurement point and the outer measurement point are arranged to provide an overlay measurement of a TSV.

20 Claims, 26 Drawing Sheets

(52) U.S. Cl.
CPC ............... *H01L 2225/06586* (2013.01); *H01L 2225/06593* (2013.01)

(56) References Cited

U.S. PATENT DOCUMENTS

| | | | |
|---|---|---|---|
| 8,659,163 B2* | 2/2014 | Park | H01L 23/5384 257/774 |
| 8,957,504 B2 | 2/2015 | Chao-Yuan et al. | |
| 9,773,831 B1 | 9/2017 | Yang et al. | |
| 9,881,992 B2 | 1/2018 | Kim | |
| 10,692,764 B2* | 6/2020 | Chang | H01L 24/03 |
| 2007/0292776 A1 | 12/2007 | Cho et al. | |
| 2009/0008790 A1* | 1/2009 | Lee | H01L 24/03 257/E23.145 |
| 2009/0186430 A1* | 7/2009 | Chen | H01L 22/34 257/E21.597 |
| 2012/0312589 A1* | 12/2012 | Balcome | H05K 3/429 156/150 |
| 2013/0015588 A1* | 1/2013 | Park | H01L 24/05 257/774 |
| 2014/0118721 A1 | 5/2014 | Shyu et al. | |
| 2014/0167289 A1* | 6/2014 | Park | H01L 25/0657 257/774 |
| 2015/0028494 A1* | 1/2015 | Park | H01L 21/76831 257/774 |
| 2017/0025384 A1* | 1/2017 | Park | H01L 23/481 |
| 2017/0053872 A1* | 2/2017 | Lee | H01L 21/76879 |
| 2017/0256501 A1 | 9/2017 | Chao et al. | |
| 2019/0378820 A1* | 12/2019 | Gao | H01L 24/05 |
| 2020/0043861 A1 | 2/2020 | Chen et al. | |
| 2020/0126917 A1* | 4/2020 | Kaeding | H01L 27/14618 |
| 2020/0273780 A1* | 8/2020 | Park | H01L 23/481 |
| 2020/0373333 A1* | 11/2020 | Liang | H01L 27/124 |
| 2022/0020667 A1* | 1/2022 | Park | H01L 21/76229 |
| 2022/0077079 A1* | 3/2022 | Chang | H01L 29/0649 |

FOREIGN PATENT DOCUMENTS

| | | |
|---|---|---|
| TW | 201135899 A1 | 10/2011 |
| TW | 201418895 A | 5/2014 |

* cited by examiner

THROUGH-SILICON VIA (TSV) KEY FOR OVERLAY MEASUREMENT, AND SEMICONDUCTOR DEVICE AND SEMICONDUCTOR PACKAGE INCLUDING TSV KEY

CROSS-REFERENCE TO RELATED APPLICATION

Korean Patent Application No. 10-2020-0147096, filed on Nov. 5, 2020, in the Korean Intellectual Property Office, and entitled: "Through-Silicon Via (TSV) Key for Overlay Measurement, and Semiconductor Device and Semiconductor Package Including TSV Key," is incorporated by reference herein in its entirety.

BACKGROUND

1. Field

Embodiments relate to a key for overlay measurement and a semiconductor device including the key, and more particularly, to a through-silicon via (TSV) key for measuring an overlay of a TSV, and a semiconductor device including the TSV key.

2. Description of the Related Art

General overlay measurement refers to detecting a degree of overlay or a degree of misalignment between an upper-layer pattern and a lower-layer pattern by using a key for overlay measurement, which is prepared on a top surface of a wafer in advance. For example, the degree of misalignment may be obtained by measuring a separation distance of an inner box, which is formed simultaneously with an upper-layer pattern, from an outer box, which is formed in advance simultaneously with a lower-layer pattern, in up and down directions or left and right directions.

SUMMARY

Embodiments are directed to a through-silicon via (TSV) key for overlay measurement, the TSV key including: a first TSV extending through at least a portion of a substrate in a first direction that is perpendicular to a top surface of the substrate; and at least one ring pattern, which is apart from and surrounds the first TSV in a second direction that is parallel to the top surface of the substrate, the at least one ring pattern being arranged in a layer that is lower than a top surface of the first TSV in the first direction, wherein an inner measurement point corresponds to the first TSV, an outer measurement point corresponds to the at least one ring pattern, and the inner measurement point and the outer measurement point are arranged to provide an overlay measurement of a TSV.

Embodiments are also directed to a semiconductor device including: a substrate; an integrated circuit layer in the substrate; a multi-wiring layer on the integrated circuit layer; a through-silicon via (TSV) key configured for overlay measurement, which includes a first TSV extending through at least a portion of the substrate in a first direction and at least one ring pattern that is apart from and surrounds the first TSV in a second direction, the first direction being perpendicular to a top surface of the substrate, the second direction being parallel to the top surface of the substrate, and the at least one ring pattern being arranged in a lower layer than a top surface of the first TSV in the first direction; and a plurality of second TSVs extending through at least a portion of the substrate in the first direction, wherein an inner measurement point corresponds to the first TSV, an outer measurement point corresponds to the at least one ring pattern, and the inner measurement point and the outer measurement point are arranged to provide an overlay measurement of a TSV.

Embodiments are also directed to a semiconductor package including: a package substrate; and at least one semiconductor chip stacked on the package substrate, wherein the at least one semiconductor chip includes: a semiconductor substrate; an integrated circuit layer in the semiconductor substrate; a multi-wiring layer on the integrated circuit layer; a through-silicon via (TSV) key configured for overlay measurement, which includes a first TSV extending through at least a portion of the semiconductor substrate in a first direction and at least one ring pattern that is apart from and surrounds the first TSV in a second direction, the first direction being perpendicular to a top surface of the semiconductor substrate, the second direction being parallel to the top surface of the semiconductor substrate, and the at least one ring pattern being arranged in a lower layer than a top surface of the first TSV in the first direction; and a plurality of second TSVs extending through at least a portion of the semiconductor substrate in the first direction, and wherein an inner measurement point corresponds to the first TSV, an outer measurement point corresponds to the at least one ring pattern, and the inner measurement point and the outer measurement point are arranged to provide an overlay measurement of a TSV.

According to yet another aspect of the inventive concept, there is provided a through-silicon via (TSV) key for overlay measurement, the TSV key including: a first TSV on a substrate; and at least one ring pattern on the substrate, the at least one ring pattern having a shape that is apart from and surrounds the first TSV, wherein an inner measurement point corresponds to the first TSV, an outer measurement point corresponds to the at least one ring pattern, and the inner measurement point and the outer measurement point are arranged to provide an overlay measurement of a TSV.

BRIEF DESCRIPTION OF THE DRAWINGS

Features will become apparent to those of skill in the art by describing in detail example embodiments with reference to the attached drawings in which.

DETAILED DESCRIPTION

Figure 1A:
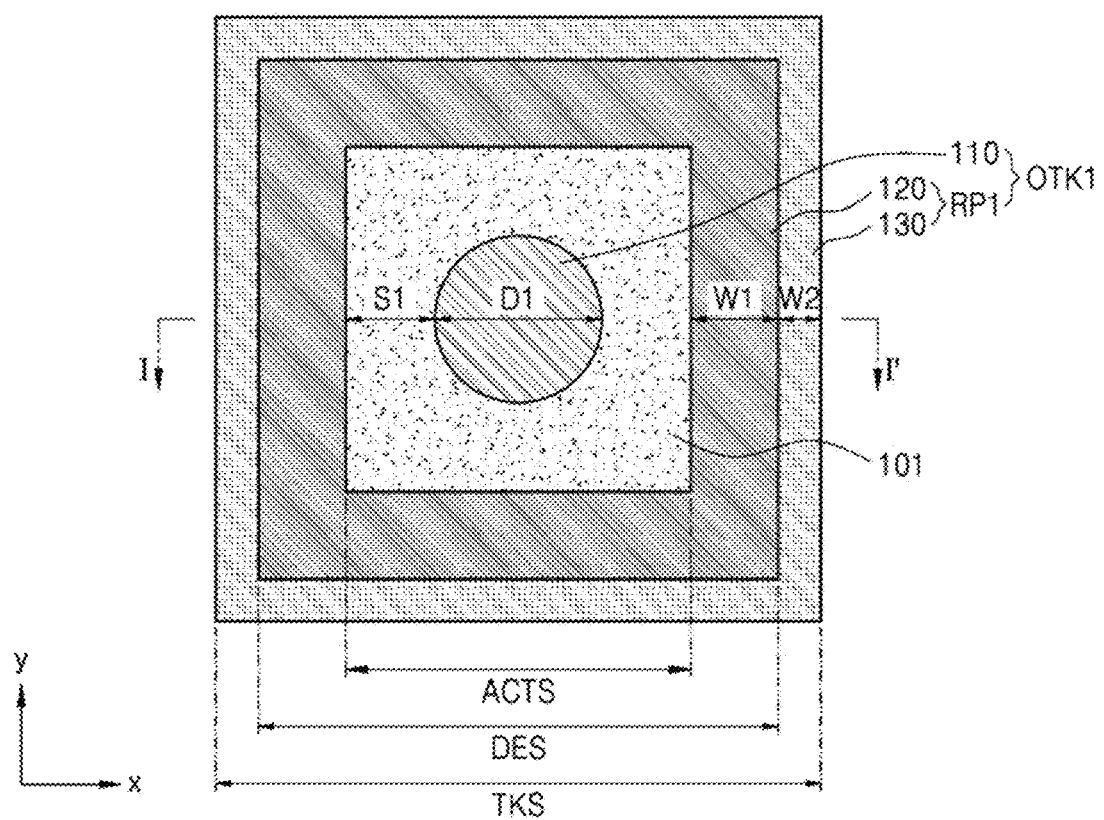
FIGS. 1A to 1C are plan views and a cross-sectional view of a through-silicon via (TSV) key for overlay measurement, according to an example embodiment.
Figure 1B:
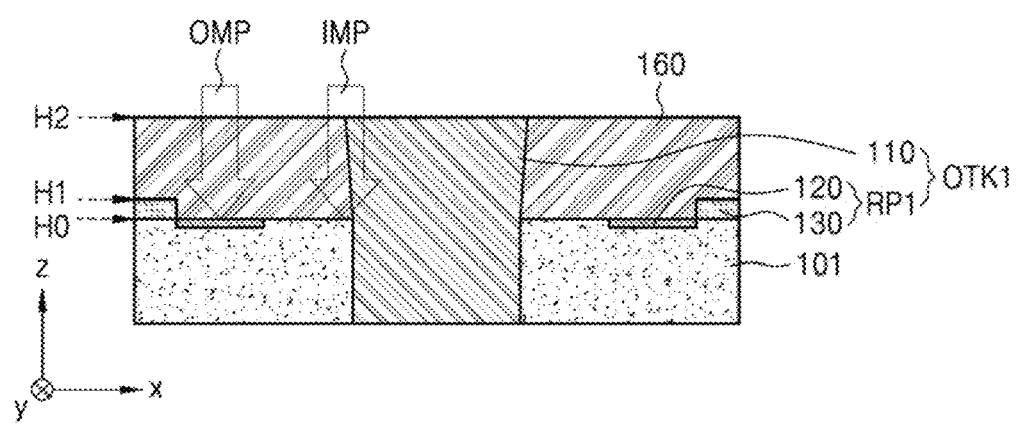
Figure 1C:
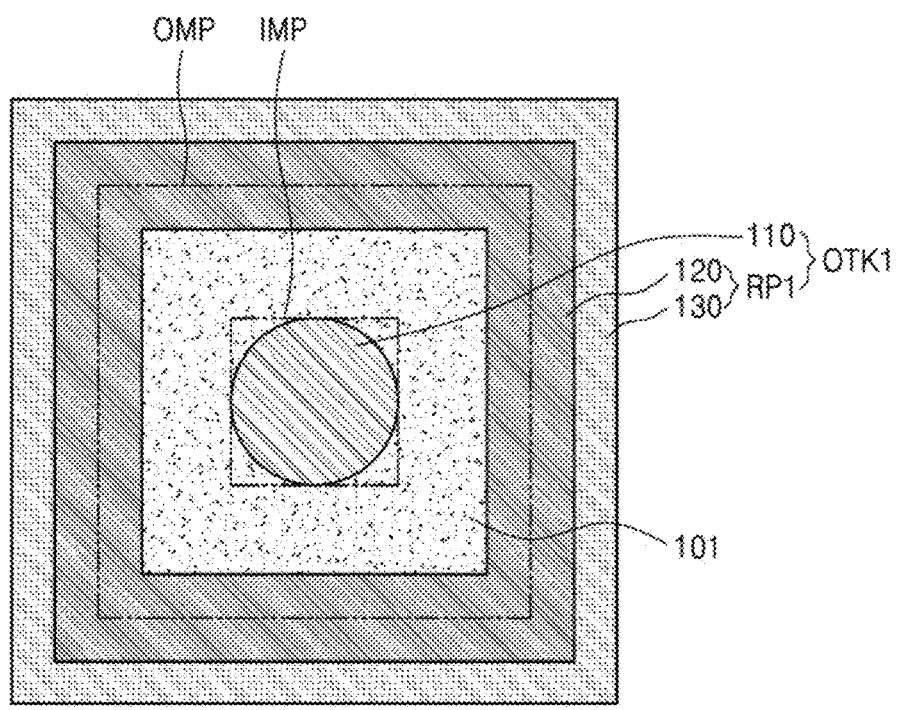

FIGS. 1A to 1C are plan views and a cross-sectional view of a through-silicon via (TSV) key for overlay measurement, according to an example embodiment, and in particular, FIG. 1B is a cross-sectional view taken along a line I-I' of FIG. 1A, and FIG. 1C is a plan view illustrating an inner measurement point and an outer measurement point in FIG. 1A. FIGS. 1A and 1C illustrate plan views from which an interlayer dielectric is omitted for convenience, and the same applies to other plan views below.

Referring to FIGS. 1A to 1C, a TSV key for overlay measurement OTK1 (simply referred to as "TSV key" hereinafter) according to the present example embodiment may include a first TSV 110, an inner ring pattern 120, and an outer ring pattern 130.

The first TSV 110 may have a horizontal cross-section having a circular shape, when taken parallel to a top surface of a substrate 101. Here, the horizontal cross-section may correspond to a plane (x-y plane) defined by a first direction (x-direction) and a second direction (y-direction). However, the shape of the horizontal cross-section of the first TSV 110 is not limited to a circular shape. For example, the shape of the horizontal cross-section of the first TSV 110 may be an elliptical shape or a polygonal shape.

The horizontal cross-section of the first TSV 110 may have a first diameter D1, and the first diameter D1 may be less than 7 μm. For example, in the TSV key OTK1 of the present example embodiment, the horizontal cross-section of the first TSV 110 may have a first diameter D1 of about 5 μm or about 4 μm. However, the first diameter D1 of the horizontal cross-section of the first TSV 110 is not limited to the numerical values set forth above. When the shape of the horizontal cross-section of the first TSV 110 is not a circular shape, the size of the horizontal cross-section of the first TSV 110 may be defined by another concept such as a minor axis, a minor side, a diagonal line, or an area. In addition, the first TSV 110 may be formed by digging the substrate 101 from one side to the other side thereof by etching, and thus diameters of an upper portion and a lower portion of the first TSV 110 may be slightly different from each other, according to example embodiments.

As shown in FIG. 1B, the first TSV 110 may extend in a third direction (z-direction), which is perpendicular to the x-y plane, and thus penetrate at least a portion of the substrate 101. In addition, the first TSV 110 may extend through an interlayer dielectric 160 on the substrate 101. A top surface of the first TSV 110 may be coplanar with a top surface of the interlayer dielectric 160. For example, the respective top surfaces of the first TSV 110 and the interlayer dielectric 160 may have a substantially equal height, that is, a second height H2. The first TSV 110 may be connected to one wiring line (see 174 of FIG. 14B), e.g., an M1 wiring line, of a multi-wiring layer (see 170 of FIG. 14B). According to example embodiments, the first TSV 110 may penetrate the multi-wiring layer 170.

In the TSV key OTK1 of the present example embodiment, the first TSV 110 may be formed together when a second TSV (see 110a of FIG. 15, or the like), which is actually operated as a through-electrode in a semiconductor device, is formed. Accordingly, the first TSV 110 may have substantially the same structure as the second TSV 110a and may include the same material as the second TSV 110a. For example, the first TSV 110 may have a three-dimensional pillar shape, and may include a barrier film at an outer surface thereof and a filling conductive layer therein. The barrier film may include at least one material selected from among Ti, TiN, Ta, TaN, Ru, Co, Mn, WN, Ni, and NiB. The filling conductive layer may include at least one material selected from among Cu, a Cu alloy such as CuSn, CuMg, CuNi, CuZn, CuPd, CuAu, CuRe, or CuW, W, a W alloy, Ni, Ru, and Co. However, the respective materials of the barrier film and the filling conductive layer are not limited to the materials set forth above. A via insulating layer may be arranged between the first TSV 110 and the substrate 101 or between the first TSV 110 and the interlayer dielectric 160. The via insulating layer may include, e.g., an oxide film, a nitride film, a polymer film, or a combination thereof.

The inner ring pattern 120 may be formed on the substrate 101. As shown in FIG. 1A, the inner ring pattern 120 may have a ring shape surrounding the first TSV 110. In the TSV key OTK1 of the present example embodiment, the inner ring pattern 120 may have a rectangular ring shape. However, the shape of the inner ring pattern 120 is not limited to the rectangular ring shape. For example, the inner ring pattern 120 may have various shapes such as a circular ring, an elliptical ring, a polygonal ring, and the like.

The inner ring pattern 120 may be arranged apart from the first TSV 110 in a horizontal direction. For example, the inner ring pattern 120 may be arranged apart from the first TSV 110 by a first interval S1 in the first direction (x-direction) or the second direction (y-direction). The first interval S1 may be 2 μm or more. In the TSV key OTK1 of the present example embodiment, the first interval S1 may be, e.g., about 2.175 μm. However, the interval by which the inner ring pattern 120 is apart from the first TSV 110 is not limited to the numerical values set forth above. The inner ring pattern 120 may have a first width W1 of 2 μm or more. In the TSV key OTK1 of the present example embodiment, the first width W1 may be, e.g., about 2.170 μm. However, the first width W1 is not limited thereto.

As illustrated in FIG. 1B, the inner ring pattern 120 may have a structure that is inserted or recessed into the substrate 101. A top surface of the inner ring pattern 120 may be at substantially the same level as the top surface of the substrate 101. Accordingly, the respective top surface of the inner ring pattern 120 and the substrate 101 may have a substantially equal height, that is, a base height H0. However, the structure of the inner ring pattern 120 is not limited to the inserted structure. For example, the inner ring pattern 120 may have a structure protruding upwards from the substrate 101.

The inner ring pattern 120 may include, e.g., an oxide film such as a silicon oxide ($SiO_2$) film. However, the material of the inner ring pattern 120 is not limited to the oxide film. For example, the inner ring pattern 120 may include an insulating film such as a nitride film, a carbide film, or a polymer film.

The substrate 101 may include, e.g., a semiconductor element such as silicon (Si) or germanium (Ge). In addition, the substrate 101 may include a compound semiconductor such as silicon carbide (SiC), gallium arsenide (GaAs), indium arsenide (InAs), or indium phosphide (InP). The substrate 101 may have a silicon-on-insulator (SOI) structure. In an example embodiment, the substrate 101 may include a buried oxide (BOX) layer. The substrate 101 may include a conductive region, e.g., an impurity-doped well or an impurity-doped structure. The substrate 101 may include various device isolation structures such as a shallow trench isolation (STI) structure.

The inner ring pattern 120 may correspond to a type of device isolation structure. Accordingly, the inner ring pattern 120 may be formed together when a device isolation structure is formed, and may include the same material as the device isolation structure. However, according to example embodiments, the inner ring pattern 120 may be formed separately from the device isolation structure. In such a case, the inner ring pattern 120 may include a different material from the device isolation structure.

The outer ring pattern 130 may be formed on the substrate 101. As shown in FIG. 1A, the outer ring pattern 130 may have a ring shape surrounding the inner ring pattern 120 and may be arranged in contact with an outer side surface of the inner ring pattern 120. Accordingly, the outer ring pattern 130 may have a rectangular ring shape, similar to the inner ring pattern 120. However, the shape of the outer ring pattern 130 is not limited to the rectangular ring shape. For example, the outer ring pattern 130 may have various shapes such as a circular ring, an elliptical ring, and a polygonal ring. In the TSV key OTK1 of the present example embodiment, the outer ring pattern 130 may have a second width W2 of about 1 μm. However, the second width W2 of the outer ring pattern 130 is not limited to the numerical value set forth above.

The outer ring pattern 130 may have a structure protruding upwards from the substrate 101. Accordingly, a top surface of the outer ring pattern 130 may have a first height H1 and may be higher than the base height H0 of the top surface of the substrate 101. However, the structure of the outer ring pattern 130 is not limited to the protruding structure. For example, the outer ring pattern 130 may have a structure inserted into the substrate 101, similar to the inner ring pattern 120. The outer ring pattern 130 may include, e.g., a polysilicon film. However, the material of the outer ring pattern 130 is not limited to the polysilicon film. According to example embodiments, the outer ring pattern 130 may include a polysilicon multilayer, or a multilayer of a polysilicon film and an insulating film. Here, the insulating film may include an oxide film, a nitride film, an oxynitride film, or a combination thereof.

The inner ring pattern 120 and the outer ring pattern 130 may constitute a first ring pattern RP1 for overlay measurement. As can be seen from FIG. 1C, in the TSV key OTK1 of the present example embodiment, an outer portion of the first TSV 110 may be an inner measurement point IMP, and a portion of the first ring pattern RP1 may be an outer measurement point OMP. More specifically, a rectangular portion along a dash-double dotted line surrounding the first TSV 110 may correspond to the inner measurement point IMP, and a rectangular portion along a dash-double dotted line marked in the middle of the inner ring pattern 120 may correspond to the outer measurement point OMP.

In the TSV key OTK1 of the present example embodiment, an overlay measurement may be performed by a same principle as a box-in-box (BIB) key pattern measurement method using an outer box mark and an inner box mark both corresponding to existing overlay keys. For example, the inner measurement point IMP may correspond to the inner box mark, and the outer measurement point OMP may correspond to the outer box mark. In addition, the inner measurement point IMP and the outer measurement point OMP may respectively correspond to portions that have the highest intensity and are distinguished well from each other, in terms of overlay measurement. Accordingly, in the TSV key OTK1 of the present example embodiment, by measuring the inner measurement point IMP and the outer measurement point OMP, an overlay of the first TSV 110 may be measured. In addition, an overlay of second TSVs 110a, which are actually operated, may be accurately determined based on the overlay of the first TSV 110.

A portion of the first ring pattern RP1, which is used for the overlay measurement, may be the inner ring pattern 120. The outer ring pattern 130 may be formed to prevent noise signals in the overlay measurement, rather than for the overlay measurement. Accordingly, according to example embodiments, the outer ring pattern 130 may be omitted.

In the TSV key OTK1 of the present example embodiment, assuming that the outer ring pattern 130 is included, the first diameter D1 is 4 μm, the first interval S1 is 2.175 μm, the first width W1 is 2.175 μm, and the second width W2 is 1 μm, a total size TKS of the TSV key OTK1 may be about 14.69 μm. When the outer ring pattern 130 is excluded, a dummy-excluded size DES of the TSV key OTK1 may be about 12.69 μm. In addition, a size ACTS of an active layer, which is arranged inside the inner ring pattern 120 and surrounds the first TSV 110, may be about 8.35 μm. Here, the active layer may refer to an impurity-doped silicon layer in a silicon layer of the substrate 101. However, the total size TKS of the TSV key OTK1, the dummy-excluded size DES of the TSV key OTK1, and the size ACTS of the active layer are not limited to the numerical values set forth above.

The TSV key OTK1 of the present example embodiment may include the first TSV 110 and the first ring pattern RP1, thereby allowing an overlay of the first TSV 110 to be accurately measured even when the first TSV 110 has a fine size. For example, even when the diameter of the first TSV 110 is less than 7 μm, the overlay of the first TSV 110 may be accurately measured by using the first TSV 110 and the first ring pattern RP1, and thus, an overlay of the second TSV 110a, which is an actually operating TSV, may be accurately determined.

For reference, in existing semiconductor devices, an overlay measurement is performed by measuring a distance between a TSV used for actual operation and an underlying-layer pattern, that is, a width of an active layer between the TSV and the underlying-layer pattern. However, as the size of a TSV decreases, it is difficult to measure the distance between the TSV and the underlying-layer pattern by using measurement equipment because the width of the active layer is small, and even when the distance therebetween is measured, a lot of errors occur. Deterioration in overlay measurement due to a reduction in the TSV size will be described below in more detail with reference to FIGS. 2A to 3.

The TSV key OTK1 of the present example embodiment includes the first TSV 110 and the first ring pattern RP1, which surrounds the first TSV 110 while apart from the first TSV 110 by as much as a certain distance, e.g., the first interval 51, and allows an overlay measurement to be performed by using the first TSV 110 as an inner measurement point and using the first ring pattern RP1 as an outer measurement point, thereby allowing the overlay of the first TSV 110 to be precisely measured even when the first TSV 110 has a fine size, e.g., a diameter less than 7 μm. In addition, the overlay of the second TSV 110a, which is an operating TSV having substantially the same structure as the first TSV 110, may be accurately determined, based on a result of the overlay measurement of the first TSV 110.

Figure 2A:
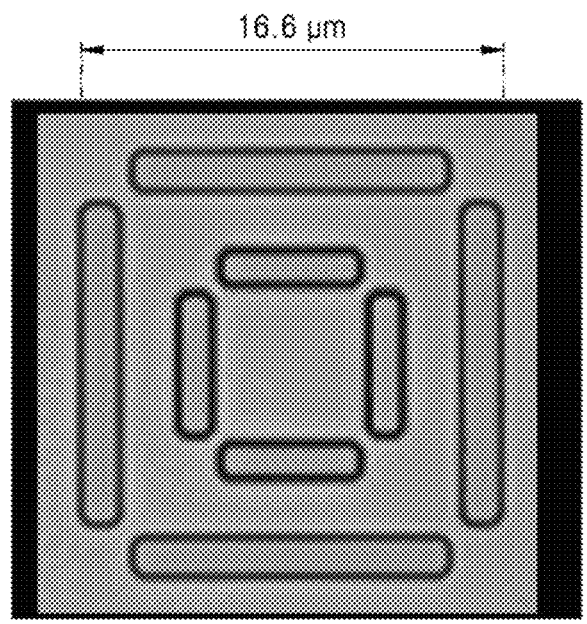
FIGS. 2A to 2D are images of a box-in-box (BIB) overlay key and cell patterns including various-sized TSVs.
Figure 2B:
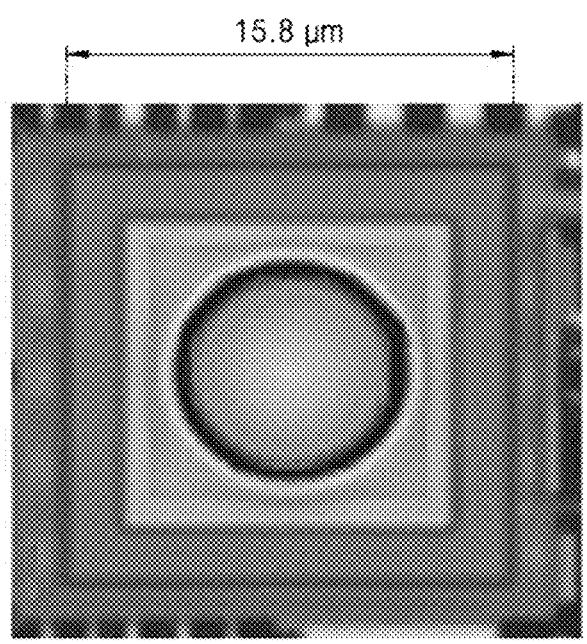
Figure 2C:
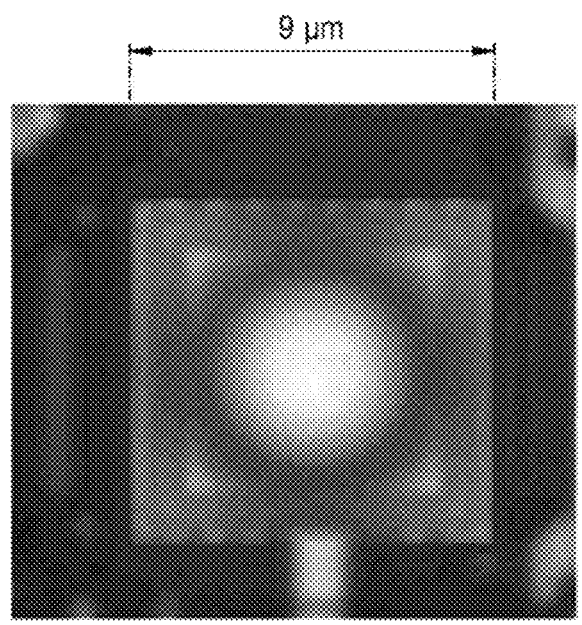
Figure 2D:
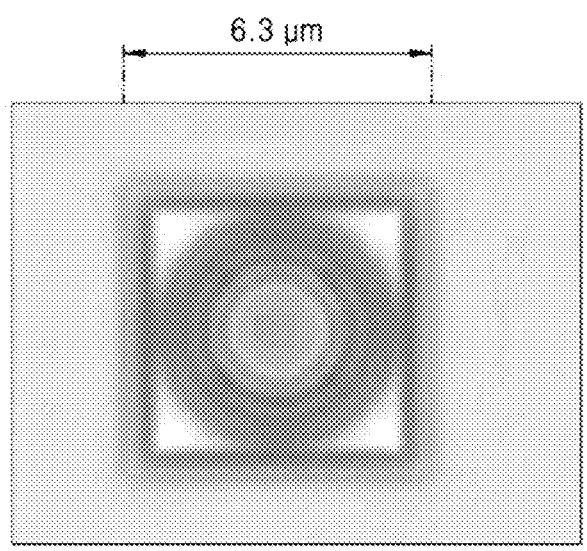
Figure 3:
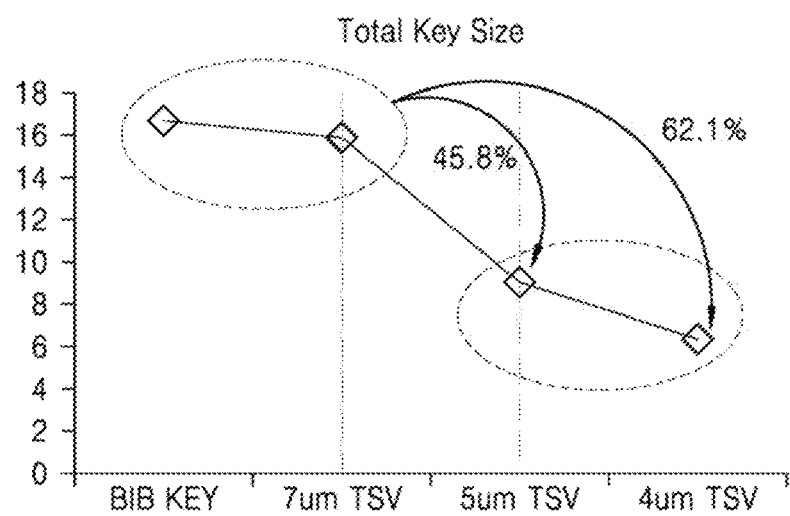
FIG. 3 is a graph depicting a degree of deterioration in TSV overlay measurement on cell patterns including various-sized TSVs, as compared with a BIB overlay key.

FIGS. 2A to 2D are images of a BIB overlay key and cell patterns including various-sized TSVs, and in particular, FIG. 2A is an image of a general BIB overlay key, and FIGS. 2B to 2D are images of cell patterns including TSVs with diameters of 7 µm, 5 µm, and 4 µm, respectively. FIG. 3 is a graph depicting a degree of deterioration in TSV overlay measurement on cell patterns including various-sized TSVs, as compared with a BIB overlay key, wherein the x-axis represents a BIB overlay key and corresponding-sized TSVs, and the y-axis represents a total key size in units of µm.

Referring to FIGS. 2A to 3, in the case of a general pattern layer, after an overlay key is formed in a scribe lane (S/L) and an overlay photolithography process is performed, when an alignment is normally confirmed, a target process may be performed by feeding back this result to a subsequent lot. However, in the case of a TSV, although an overlay measurement is performed by measuring an actually used TSV because an overlay key pattern is not allowed to be formed in the S/L, as the TSV has a fine size, it is difficult to perform normal alignment measurement due to a small interval between the TSV and an underlying-layer pattern.

More specifically, the total size of the BIB overlay key of FIG. 2A may have dimensions of about 16.6 µm×about 16.6 µm. Here, the total size of the BIB overlay key may be defined as the size of the outer box. In the cell patterns including the TSVs having diameters of 7 µm, 5 µm, and 4 µm in FIGS. 2B to 2D, respectively, the total sizes of surrounding patterns (each referred to as a "TSV surrounding pattern" hereinafter) capable of being used for TSV overlay measurement may have dimensions of about 15.8 µm×about 15.8 µm, about 9 µm×about 9 µm, and about 6.3 µm×about 6.3 µm, respectively. Here, the total size of a TSV surrounding pattern may be defined as the size of a distinguishable rectangle in an outermost portion thereof.

As can be seen from FIG. 2B and the graph of FIG. 3, in the case of the cell pattern including the TSV with a diameter of 7 µm, the total size of the TSV surrounding pattern is similar to the size of the BIB overlay key, and the TSV may be clearly distinguished from rectangles outside thereof. Accordingly, similar to the BIB overlay key, an overlay measurement may be performed by using the TSV surrounding pattern. On the other hand, as can be seen from FIGS. 2C and 2D and the graph of FIG. 3, in the case of the cell patterns including the TSVs with diameters of 5 µm and 4 µm, respectively, the sizes of the TSV surrounding patterns are respectively reduced by as much as 46.8% and 62.1%, as compared with the size of the BIB overlay key, and each TSV is not clearly distinguished from rectangles outside thereof. Accordingly, in the case of the cell patterns including the TSVs with diameters of 5 µm and 4 µm, an overlay measurement using the TSV surrounding pattern may be difficult and a result thereof may contain a large margin of error.

Therefore, when the size of the second TSV 110a, which is an operating TSV, is small, e.g., when the size of the second TSV 110a is less than 7 µm, the TSV key OTK1 of the present example embodiment, which includes the first TSV 110, may be intentionally formed in a semiconductor device chip separately from the second TSV 110a, for an overlay measurement. In addition, the TSV key OTK1 of the present example embodiment may be arranged at various locations in the semiconductor device chip. Arrangement locations of the TSV key OTK1 in the semiconductor device chip will be described below in more detail with reference to FIGS. 14A and 14B.

FIG. 4A to 13 are plan views and cross-sectional views of TSV keys, according to an example embodiment. FIGS. 4B, 5B, 6B, 7B, and 12B illustrate cross-sectional views, taken along a line II-II' of FIG. 4A, a line III-III' of FIG. 5A, a line IV-IV' of FIG. 6A, a line V-V' of FIG. 7A, and a line VI-VI' of FIG. 12A, respectively. The descriptions given already with reference to FIGS. 1A to 3 are briefly given or omitted.

Figure 4A:
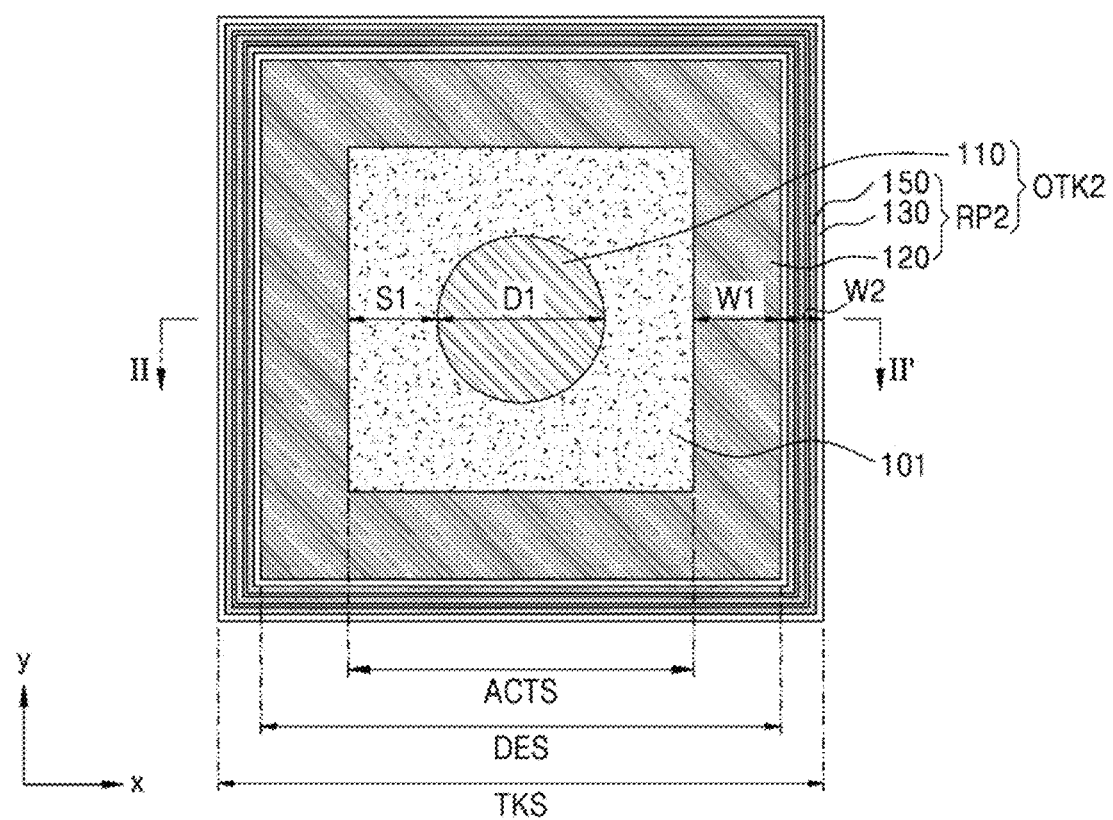
FIGS. 4A to 13 are plan views and cross-sectional views of TSV keys for overlay measurement, according to an example embodiment.
Figure 4B:
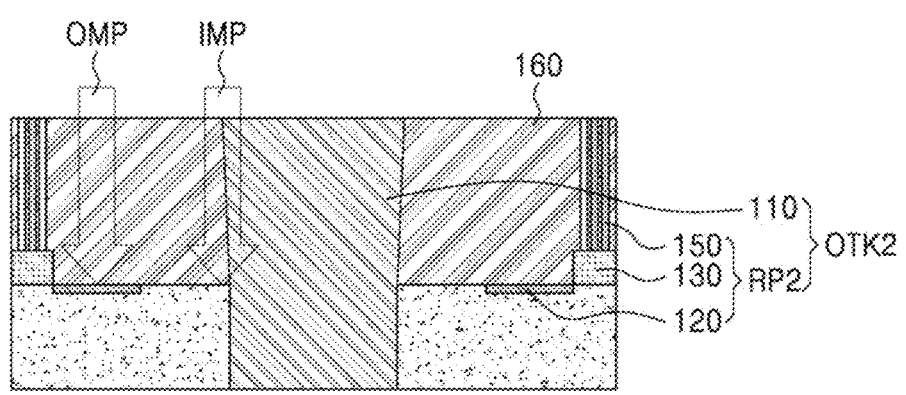

Referring to FIGS. 4A and 4B, a TSV key OTK2 of the present example embodiment may be different from the TSV key OTK1 of FIG. 1A, in terms of structures of outer ring patterns 130 and 150. More specifically, the TSV key OTK2 of the present example embodiment may include the first TSV 110, the inner ring pattern 120, and the outer ring patterns 130 and 150. The outer ring patterns 130 and 150 may include a lower outer ring pattern 130 and an upper outer ring pattern 150. The lower outer ring pattern 130 may be substantially the same as the outer ring pattern 130 of the TSV key OTK1 of FIG. 1A. Accordingly, the lower outer ring pattern 130 may include a polysilicon film. However, the material of the lower outer ring pattern 130 is not limited to the polysilicon film.

The upper outer ring pattern 150 may be formed on the lower outer ring pattern 130 and, as shown in FIG. 4B, may extend through the interlayer dielectric 160 in the third direction (z-direction). A top surface of the upper outer ring pattern 150 may be exposed by the interlayer dielectric 160. As shown in FIG. 4A, although the upper outer ring pattern 150 has a three-ply line shape, the shape of the upper outer ring pattern 150 is not limited thereto. For example, the upper outer ring pattern 150 may have a one-ply line shape. The upper outer ring pattern 150 may include a metal, e.g., tungsten (W). However, the material of the upper outer ring pattern 150 is not limited to W.

The inner ring pattern 120 and the outer ring patterns 130 and 150 may constitute a second ring pattern RP2. Similar to the TSV key OTK1 of FIG. 1A, the first TSV 110 may be the inner measurement point IMP, and the inner ring pattern 120 in the second ring pattern RP2 may be the outer measurement point OMP. In addition, the outer ring patterns 130 and 150 may function to prevent noise signals. According to an example embodiment, the outer ring patterns 130 and 150 may be omitted.

Figure 5A:
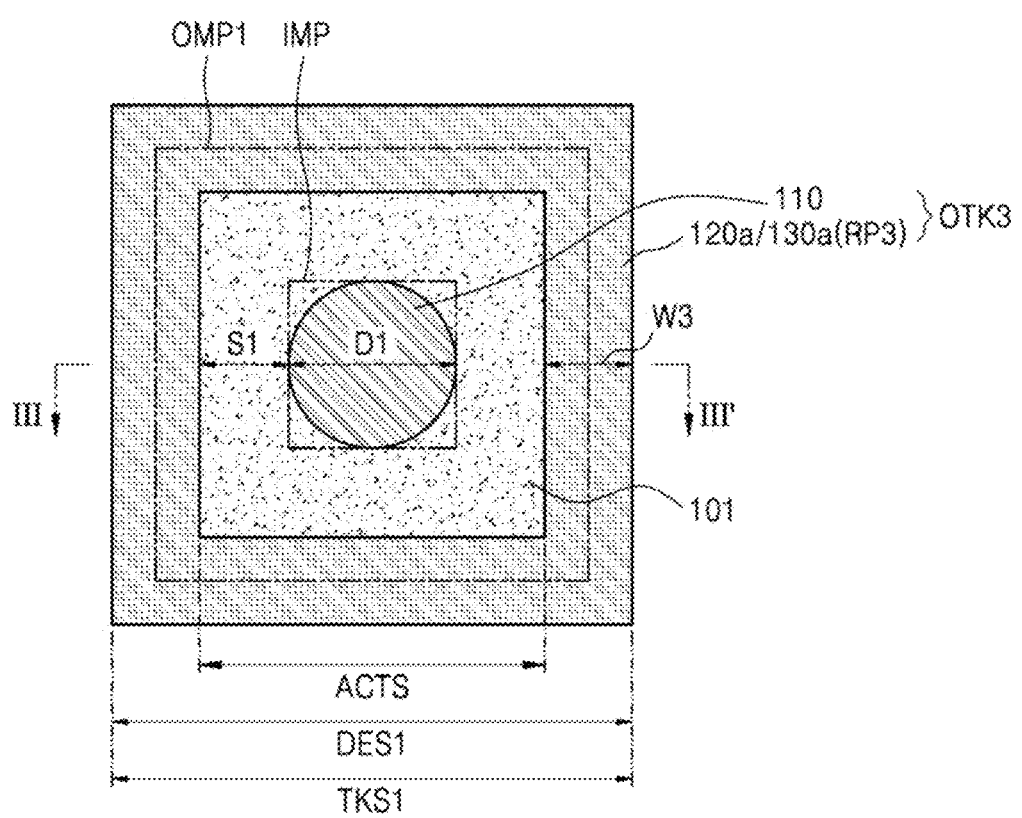
Figure 5B:
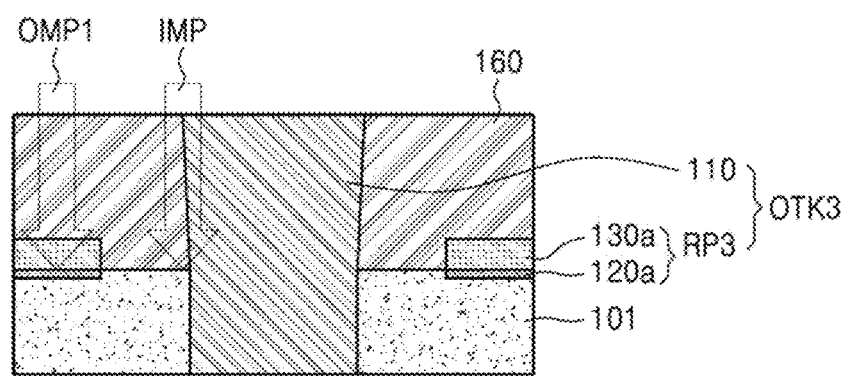

Referring to FIGS. 5A and 5B, a TSV key OTK3 of the present example embodiment may be different from the TSV key OTK1 of FIG. 1A, in terms of a structure of a third ring pattern RP3. More specifically, the TSV key OTK3 of the present example embodiment may include the first TSV 110 and the third ring pattern RP3. The third ring pattern RP3 may be formed as one ring pattern without separation between an inner ring pattern and an outer ring pattern.

The third ring pattern RP3 may be arranged apart from the first TSV 110 by the first interval S1 and may have a rectangular ring shape. The first interval S1 may be, e.g., 2 µm or more. In addition, the third ring pattern RP3 may have a third width W3. In the TSV key OTK3 of the present example embodiment, each of the first interval S1 and the third width W3 may be, e.g., 2.175 µm. However, the first interval S1 and the third width W3 are not limited to the numerical value set forth above.

The third ring pattern RP3 may include a lower third ring pattern 120a and an upper third ring pattern 130a. The lower third ring pattern 120a may have a structure inserted into the substrate 101. The lower third ring pattern 120a may include, e.g., an oxide film. However, the structure and material of the lower third ring pattern 120a are not respectively limited to the inserted structure and the oxide film, which are set forth above. The upper third ring pattern 130a may have a structure protruding upwards from the substrate 101. The upper third ring pattern 130a may include, e.g., a polysilicon film. However, the structure and material of the upper third ring pattern 130a are not respectively limited to the protruding structure and the polysilicon film, which are set forth above. According to example embodiments, the third ring pattern RP3 may include a ring pattern including three or more layers.

In the TSV key OTK3 of the present example embodiment, the first TSV 110 may be the inner measurement point IMP, and the third ring pattern RP3 may be an outer measurement point OMP1. For example, a rectangular portion along a dash-double dotted line surrounding the first TSV 110 may correspond to the inner measurement point IMP, and a rectangular portion along a dash-double dotted line marked in the middle of the third ring pattern RP3 may correspond to the outer measurement point OMP1. In addition, because the third ring pattern RP3 is formed as one ring pattern and functions as the outer measurement point OMP1, the third ring pattern RP3 may correspond to the inner ring pattern 120 of the TSV key OTK1 of FIG. 1A in terms of functionality, and the TSV key OTK3 may not include a portion corresponding to the outer ring pattern 130 of the TSV key OTK1 of FIG. 1A. Accordingly, in the TSV key OTK3 of the present example embodiment, a total size TKS1 of the TSV key OTK3 and a dummy-excluded size DES1 of the TSV key OTK3 may be substantially equal to each other, that is, may be 12.69 μm. However, the total size TKS1 of the TSV key OTK3 and the dummy-excluded size DES1 of the TSV key OTK3 are not limited to the numerical value set forth above.

Figure 6A:
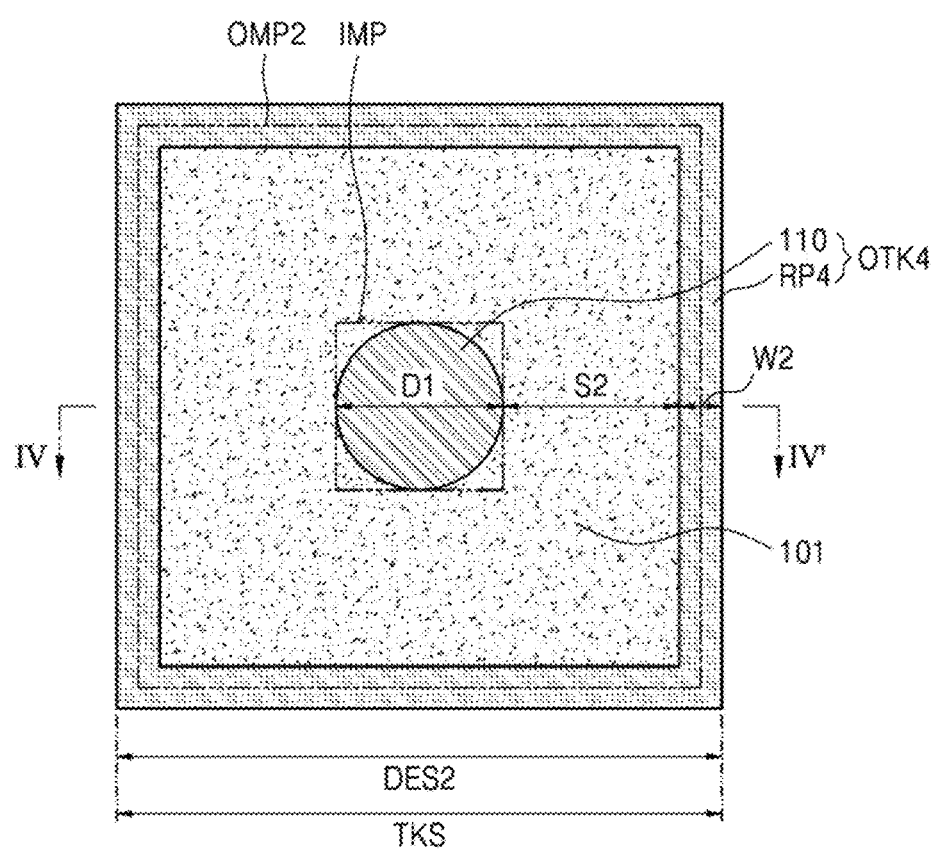
Figure 6B:
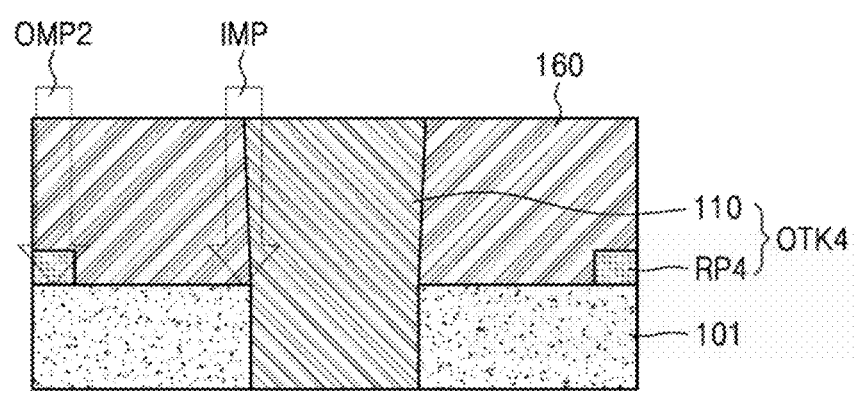

Referring to FIGS. 6A and 6B, a TSV key OTK4 of the present example embodiment may be different from the TSV key OTK1 of FIG. 1A, in terms of a structure of a fourth ring pattern RP4. More specifically, the TSV key OTK4 of the present example embodiment may include the first TSV 110 and the fourth ring pattern RP4. The fourth ring pattern RP4 may be formed as one ring pattern without separation between an inner ring pattern and an outer ring pattern.

The fourth ring pattern RP4 may be arranged apart from the first TSV 110 by a second interval S2 and may have a rectangular ring shape. The second interval S2 may be, e.g., 4 μm or more. In addition, the fourth ring pattern RP4 may have a second width W2. In the TSV key OTK4 of the present example embodiment, e.g., the second interval S2 may be 4.345 μm, and the second width W2 may be 1 μm. However, the second interval S2 and the second width W2 are not limited to the numerical values set forth above.

The fourth ring pattern RP4 may be formed in a single layer and may have a structure protruding upwards from the substrate 101. The fourth ring pattern RP4 may include, e.g., a polysilicon film. However, the structure and material of the fourth ring pattern RP4 are not respectively limited to the protruding structure and the polysilicon film, which are set forth above.

In the TSV key OTK4 of the present example embodiment, the first TSV 110 may be the inner measurement point IMP, and the fourth ring pattern RP4 may be an outer measurement point OMP2. For example, a rectangular portion along a dash-double dotted line surrounding the first TSV 110 may correspond to the inner measurement point IMP, and a rectangular portion along a dash-double dotted line marked in the middle of the fourth ring pattern RP4 may correspond to the outer measurement point OMP2. However, because the width of the fourth ring pattern RP4 is small, the entire fourth ring pattern RP4 may correspond to the outer measurement point OMP2.

Also in the TSV key OTK4 of the present example embodiment, the fourth ring pattern RP4 may correspond to the inner ring pattern 120 of the TSV key OTK1 of FIG. 1A in terms of functionality, and the TSV key OTK4 may not include a portion corresponding to the outer ring pattern 130 of the TSV key OTK1 of FIG. 1A. Accordingly, in the TSV key OTK4 of the present example embodiment, the total size TKS of the TSV key OTK4 and a dummy-excluded size DES2 of the TSV key OTK4 may be substantially equal to each other, that is, may be 14.69 μm. However, the total size TKS of the TSV key OTK4 and the dummy-excluded size DES2 of the TSV key OTK4 are not limited to the numerical value set forth above.

Figure 7A:
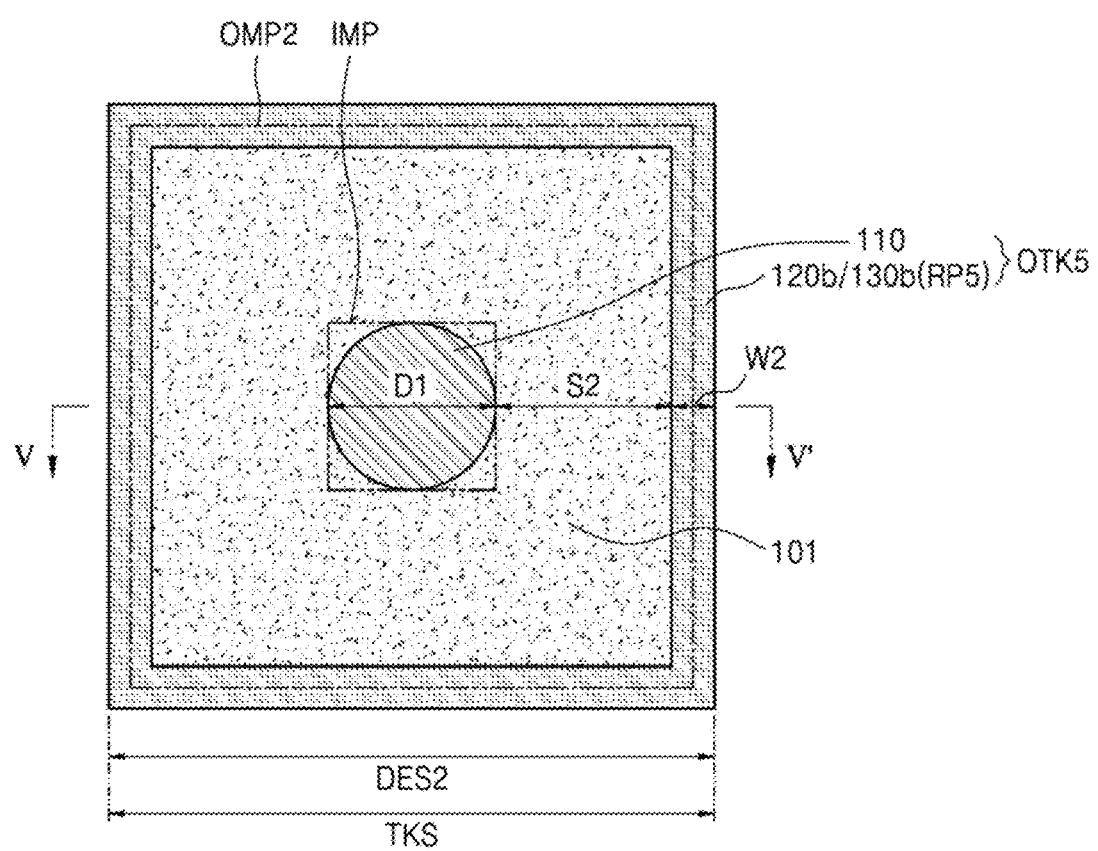
Figure 7B:
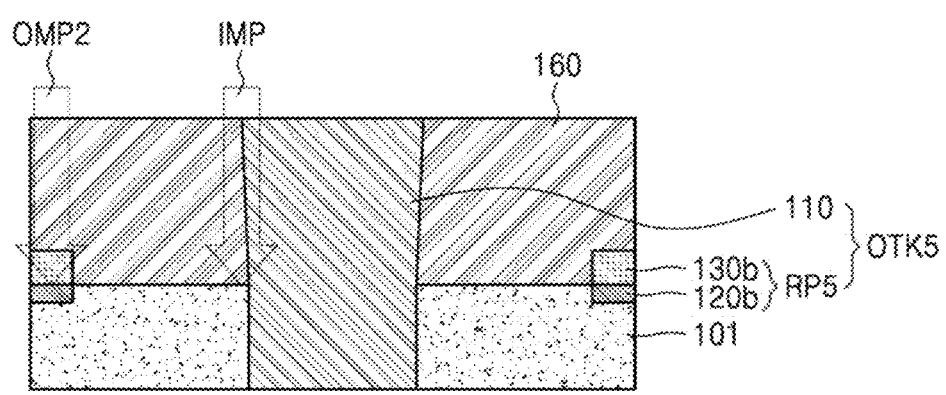

Referring to FIGS. 7A and 7B, a TSV key OTK5 of the present example embodiment may be different from the TSV key OTK4 of FIGS. 6A and 6B, in terms of a structure of a fifth ring pattern RP5. More specifically, the TSV key OTK5 of the present example embodiment may include the first TSV 110 and the fifth ring pattern RP5. The fifth ring pattern RP5 may be formed as one ring pattern without separation between an inner ring pattern and an outer ring pattern.

The fifth ring pattern RP5 may be arranged apart from the first TSV 110 by the second interval S2 and may have a rectangular ring shape. The second interval S2 may be, e.g., 4 μm or more. In addition, the fifth ring pattern RP5 may have a second width W2. In the TSV key OTK5 of the present example embodiment, e.g., the second interval S2 may be 4.345 μm, and the second width W2 may be 1 μm. However, the second interval S2 and the second width W2 are not limited to the numerical values set forth above.

The fifth ring pattern RP5 may include a lower fifth ring pattern 120b and an upper fifth ring pattern 130b. The lower fifth ring pattern 120b may have a structure inserted into the substrate 101. The lower fifth ring pattern 120b may include, e.g., an oxide film. However, the structure and material of the lower fifth ring pattern 120b are not respectively limited to the inserted structure and the oxide film, which are set forth above. The upper fifth ring pattern 130b may have a structure protruding upwards from the substrate 101. The upper fifth ring pattern 130b may include, e.g., a polysilicon film. However, the structure and material of the upper fifth ring pattern 130b are not respectively limited to the protruding structure and the polysilicon film, which are set forth above. According to example embodiments, the fifth ring pattern RP5 may include a ring pattern including three or more layers.

In the TSV key OTK5 of the present example embodiment, the first TSV 110 may be the inner measurement point IMP, and the fifth ring pattern RP5 may be the outer measurement point OMP2. For example, a rectangular portion along a dash-double dotted line surrounding the first TSV 110 may correspond to the inner measurement point IMP, and a rectangular portion along a dash-double dotted line marked in the middle of the fifth ring pattern RP5 may correspond to the outer measurement point OMP2. However, because the width of the fifth ring pattern RP5 is small, the entire fifth ring pattern RP5 may correspond to the outer measurement point OMP2.

In the TSV key OTK5 of the present example embodiment, the fifth ring pattern RP5 may correspond to the inner ring pattern 120 of the TSV key OTK1 of FIG. 1A in terms of functionality, and the TSV key OTK5 may not include a portion corresponding to the outer ring pattern 130 of the TSV key OTK1 of FIG. 1A. Accordingly, in the TSV key OTK5 of the present example embodiment, the total size TKS of the TSV key OTK5 and the dummy-excluded size DES2 of the TSV key OTK5 may be substantially equal to each other, that is, may be 14.69 μm. However, the total size TKS of the TSV key OTK5 and the dummy-excluded size DES2 of the TSV key OTK5 are not limited to the numerical value set forth above.

Figure 8:
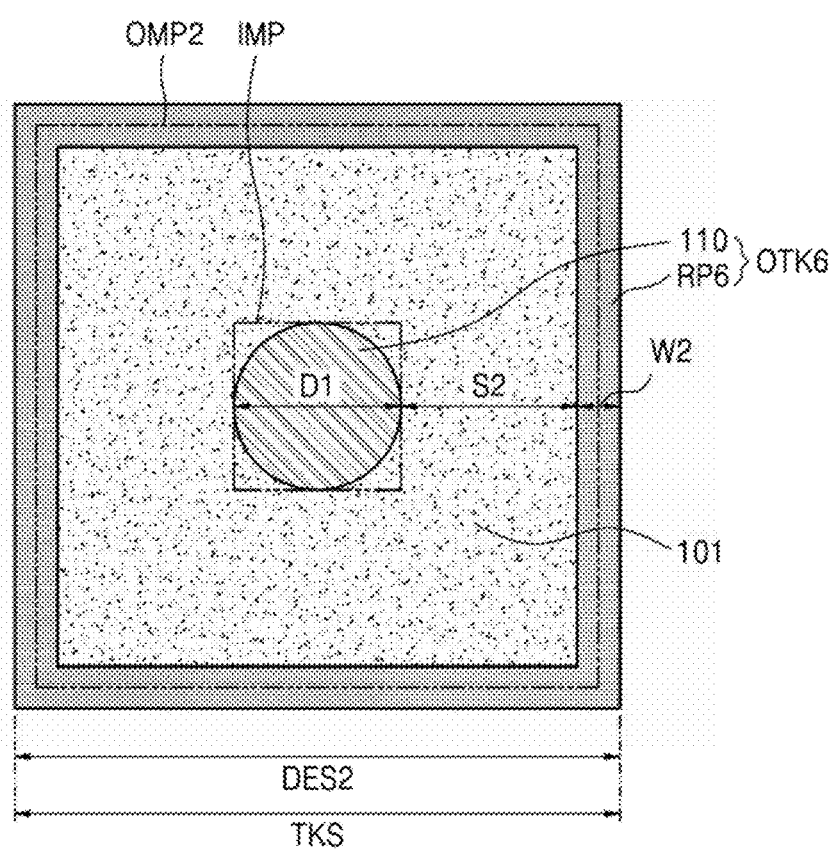

Referring to FIG. 8, a TSV key OTK6 of the present example embodiment may be different from the TSV key OTK4 or OTK5 of FIG. 6A or 7A, in terms of a material of a sixth ring pattern RP6. More specifically, the TSV key OTK6 of the present example embodiment may include the first TSV 110 and the sixth ring pattern RP6. In addition, the sixth ring pattern RP6 may be formed as one ring pattern without separation between an inner ring pattern and an outer ring pattern.

The sixth ring pattern RP6 may be formed in a single layer, like the fourth ring pattern RP4 of the TSV key OTK4 of FIG. 6A, and may include a metal film such as W. In addition, the sixth ring pattern RP6 may also be formed in double layers, like the fifth ring pattern RP5 of the TSV key OTK5 of FIG. 7A. In such a case, a lower sixth ring pattern may include an oxide film, and an upper sixth ring pattern may include a metal film such as W. In addition, according to example embodiments, the sixth ring pattern RP6 may include a ring pattern including three or more layers. In such a case, an uppermost layer of the ring pattern may include a metal film such as W. However, the material of the metal film is not limited to W.

The sixth ring pattern RP6 of the TSV key OTK6 of the present example embodiment may have a structure covered by the interlayer dielectric 160. However, according to example embodiments, the sixth ring pattern RP6 may extend through the interlayer dielectric 160. Accordingly, a top surface of the sixth ring pattern RP6 may be exposed by the interlayer dielectric 160.

In addition, descriptions regarding an interval of the sixth ring pattern RP6 from the first TSV 110, the width of the sixth ring pattern RP6, an inserted or protruding structure of the sixth ring pattern RP6, inner and outer measurement points in the TSV key OTK6, the total size and dummy-excluded size of the TSV key OTK6, and the like are the same as described regarding the TSV key OTK4 or OTK5 of FIG. 6A or 7A.

Figure 9:
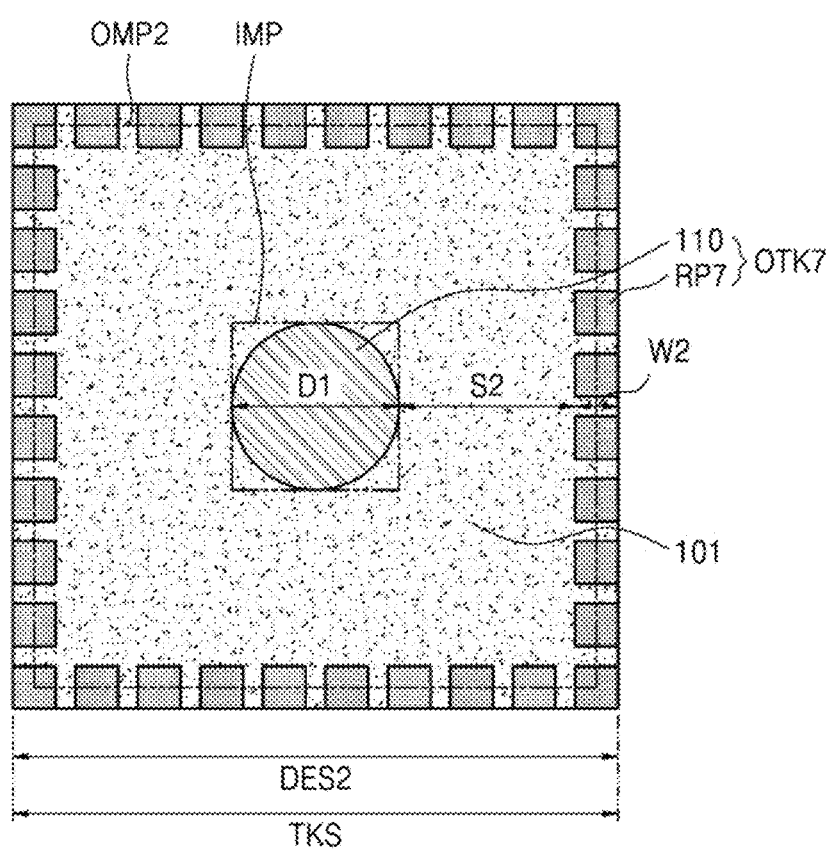

Referring to FIG. 9, a TSV key OTK7 of the present example embodiment may be different from the TSV key OTK6 of FIG. 8, in terms of a structure of a seventh ring pattern RP7. More specifically, the TSV key OTK7 of the present example embodiment may include the first TSV 110 and the seventh ring pattern RP7. The seventh ring pattern RP7 may have a structure in which quadrangular fine patterns are arranged apart from each other and collectively constitute a rectangular ring shape. Each of the fine patterns constituting the seventh ring pattern RP7 may include a metal film such as W. However, the material of each of the fine patterns is not limited to the metal film. Each of the fine patterns is not limited to the quadrangular shape and may have a circular shape, an elliptical shape, or a polygonal shape.

The seventh ring pattern RP7 may be arranged apart from the first TSV 110 by the second interval S2, e.g., as determined at an inner edge of the fine patterns. The second interval S2 may be, e.g., 4 μm or more. In addition, each of the fine patterns constituting the seventh ring pattern RP7 may have a second width W2, and the second width W2 may be, e.g., 1 μm. The second interval S2 and the second width W2 are not limited to the numerical values set forth above. The seventh ring pattern RP7 of the TSV key OTK7 of the present example embodiment may have a structure covered by the interlayer dielectric 160. However, according to example embodiments, the seventh ring pattern RP7 may extend through the interlayer dielectric 160. Accordingly, a top surface of the seventh ring pattern RP7, that is, top surfaces of the fine patterns, may be exposed by the interlayer dielectric 160.

In addition, descriptions regarding an inserted or protruding structure of the seventh ring pattern RP7, inner and outer measurement points in the TSV key OTK7, the total size and dummy-excluded size of the TSV key OTK7, and the like are the same as described regarding the TSV key OTK4 or OTK5 of FIG. 6A or 7A.

Figure 10:
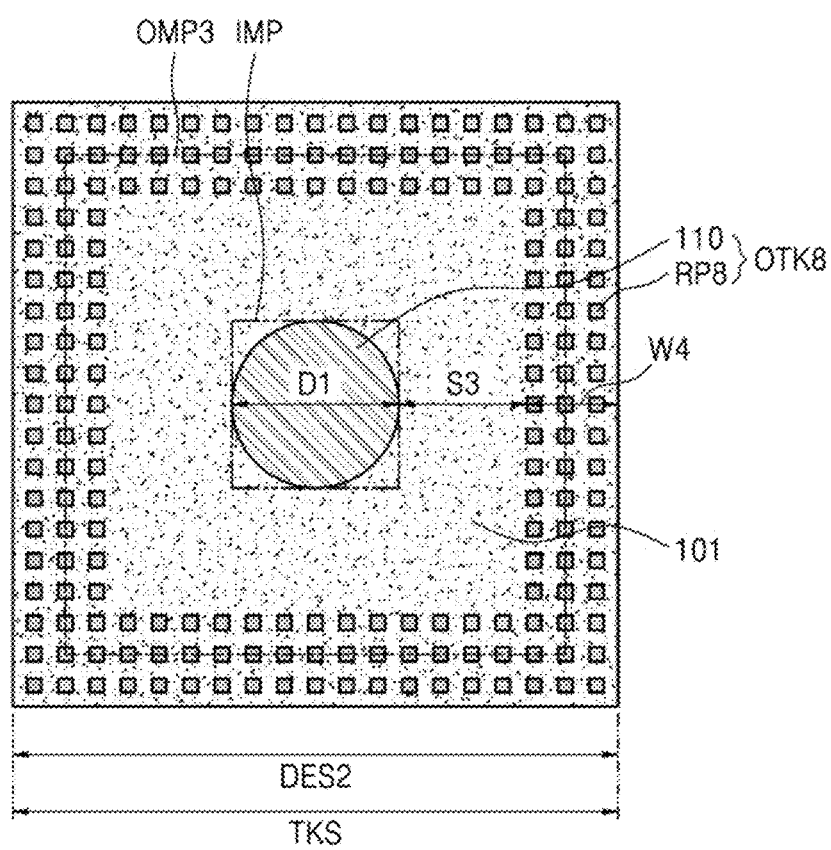

Referring to FIG. 10, a TSV key OTK8 of the present example embodiment may be different from the TSV key OTK7 of FIG. 9, in terms of a structure of an eighth ring pattern RP8. More specifically, the TSV key OTK8 of the present example embodiment may include the first TSV 110 and the eighth ring pattern RP8. The eighth ring pattern RP8 may have a structure in which quadrangular fine patterns are arranged apart from each other and collectively constitute a rectangular ring shape. In addition, in the eighth ring pattern RP8, the fine patterns may constitute a three-ply rectangular ring shape. However, in the eighth ring pattern RP8, the rectangular ring shape by the fine patterns is not limited to the three-ply structure and may have a two-ply structure or a four or more-ply structure. Each of the fine patterns constituting the eighth ring pattern RP8 may include a metal film such as W. However, the material of each of the fine patterns is not limited to the metal film. Each of the fine patterns is not limited to the quadrangular shape and may have a circular shape, an elliptical shape, or a polygonal shape. In addition, when the fine patterns have extremely fine sizes, the fine patterns may be treated as dots without distinction of shapes thereof The eighth ring pattern RP8 may be arranged apart from the first TSV 110 by a third interval S3, e.g., as determined at an inner edge of the fine patterns. The third interval S3 may be, e.g., 3 μm or more. In addition, the total width of the eighth ring pattern RP8 may be a fourth width W4, and the fourth width W4 may be, e.g., 2 μm. Further, each of the fine patterns constituting the eighth ring pattern RP8 may have a width less than 0.5 μm. However, the third interval S3, the fourth width W4, and the widths of the fine patterns are not limited to the numerical values set forth above. The eighth ring pattern RP8 of the TSV key OTK8 of the present example embodiment may have a structure covered by the interlayer dielectric 160. However, according to example embodiments, the eighth ring pattern RP8 may extend through the interlayer dielectric 160. Accordingly, a top surface of the eighth ring pattern RP8, that is, top surfaces of the fine patterns, may be exposed by the interlayer dielectric 160.

In the TSV key OTK8 of the present example embodiment, the first TSV 110 may be the inner measurement point IMP, and the eighth ring pattern RP8 may be an outer measurement point OMP3. For example, a rectangular portion along a dash-double dotted line surrounding the first TSV 110 may correspond to the inner measurement point IMP, and a rectangular portion along a dash-double dotted line marked in the middle of the eighth ring pattern RP8 may correspond to the outer measurement point OMP3.

In addition, descriptions regarding an inserted or protruding structure of the eighth ring pattern RP8, the total size and dummy-excluded size of the TSV key OTK8, and the like are the same as described regarding the TSV key OTK4 or OTK5 of FIG. 6A or 7A.

Figure 11:
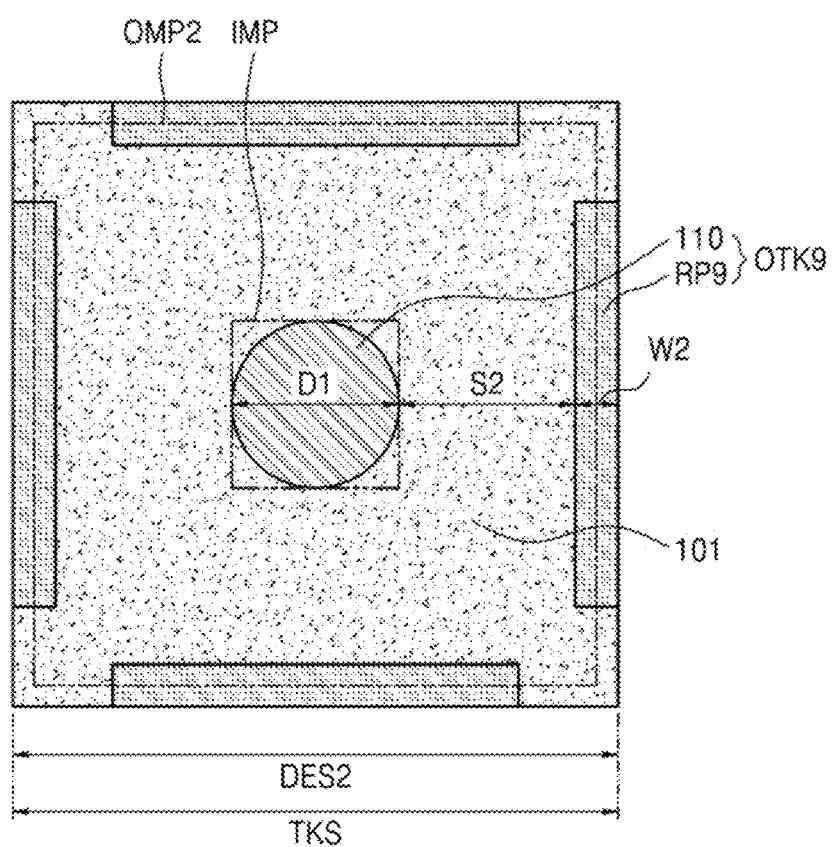

Referring to FIG. 11, a TSV key OTK9 of the present example embodiment may be different from the TSV key OTK4, OTK5, or OTK6 of FIG. 6A, 7A, or 8, in terms of a structure of a ninth ring pattern RP9. More specifically, the TSV key OTK9 of the present example embodiment may include the first TSV 110 and the ninth ring pattern RP9. The ninth ring pattern RP9 may have a structure in which straight line-shaped line patterns are arranged apart from each other and collectively constitute a rectangular ring shape. Each of the line patterns constituting the ninth ring pattern RP9 may include an oxide film, a nitride film, an oxynitride film, a polysilicon film, or a metal film such as W. The material of each of the line patterns constituting the ninth ring pattern RP9 is not limited to the materials set forth above. Each of the line patterns constituting the ninth ring pattern RP9 may include a single layer or multiple layers.

The ninth ring pattern RP9 may be arranged apart from the first TSV 110 by the second interval S2, and each of the line patterns constituting the ninth ring pattern RP9 may have a second width W2. The second interval S2 may be, e.g., 4 μm or more, and the second width W2 may be, e.g., 1 μm. However, the second interval S2 and the second width W2 are not limited to the numerical values set forth above. The ninth ring pattern RP9 of the TSV key OTK9 of the present example embodiment may have a structure covered by the interlayer dielectric 160. However, according to example embodiments, the ninth ring pattern RP9 may extend through the interlayer dielectric 160. Accordingly, a top surface of the ninth ring pattern RP9, that is, top surfaces of the line patterns, may be exposed by the interlayer dielectric 160.

In addition, descriptions regarding an inserted or protruding structure of the ninth ring pattern RP9, inner and outer measurement points in the TSV key OTK9, the total size and dummy-excluded size of the TSV key OTK9, and the like are the same as described regarding the TSV key OTK4 or OTK5 of FIG. 6A or 7A.

Figure 12A:
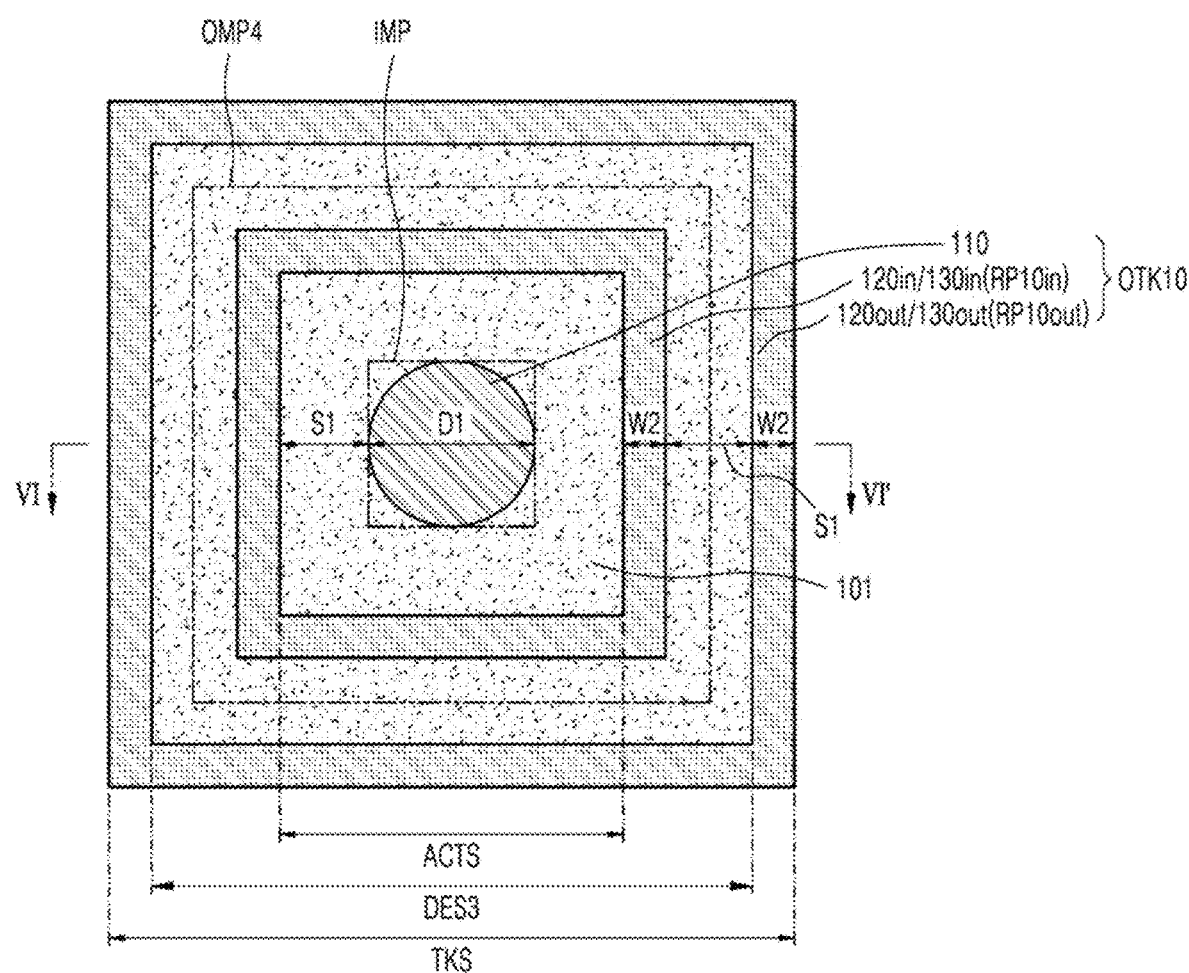
Figure 12B:
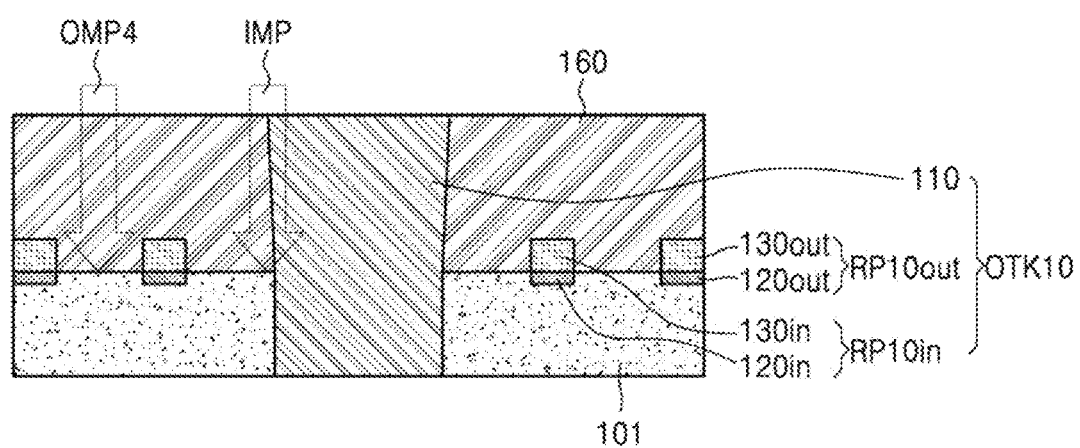

Referring to FIGS. 12A and 12B, a TSV key OTK10 of the present example embodiment may be different from the TSV key OTK1 of FIG. 1A, in terms of a structure of a tenth ring pattern RP10. More specifically, the TSV key OTK10 of the present example embodiment may include the first TSV 110, an inner tenth ring pattern RP10in, and an outer tenth ring pattern RP10out. In addition, as shown in FIG. 12A, the inner tenth ring pattern RP10in and the outer tenth ring pattern RP10out may respectively have rectangular ring patterns and may be arranged apart from each other. For example, the inner tenth ring pattern RP10in may be arranged apart from the first TSV 110 by the first interval S1. In addition, the outer tenth ring pattern RP10out may be arranged apart from the inner tenth ring pattern RP10in by the first interval S1 while surrounding the inner tenth ring pattern RP10in. The first interval S1 may be 2 μm or more. Each of the inner tenth ring pattern RP10 in and the outer tenth ring pattern RP10out may have a second width W2. In the TSV key OTK10 of the present example embodiment, the first interval S1 may be 2.175 μm, and the second width W2 may be about 1 μm. However, the first interval S1 and the second width W2 are not limited to the numerical values set forth above.

As shown in FIG. 12B, the inner tenth ring pattern RP10in may include a lower inner tenth ring pattern 120in and an upper inner tenth ring pattern 130in. In addition, the outer tenth ring pattern RP10out may include a lower outer tenth ring pattern 120out and an upper outer tenth ring pattern 130out.

The lower inner tenth ring pattern 120in and the lower outer tenth ring pattern 120out may have the same structure in a cross-sectional view and may include the same material. For example, each of the lower inner tenth ring pattern 120in and the lower outer tenth ring pattern 120out may have an inserted structure and may include an oxide film. However, the structure and material of each of the lower inner tenth ring pattern 120in and the lower outer tenth ring pattern 120out are not respectively limited to the inserted structure and the oxide film. In addition, the upper inner tenth ring pattern 130in and the upper outer tenth ring pattern 130out may be respectively formed in protruding structures on the lower inner tenth ring pattern 120in and the lower outer tenth ring pattern 120out, which respectively correspond thereto, and may respectively include polysilicon films. However, the structure and material of each of the upper inner tenth ring pattern 130in and the upper outer tenth ring pattern 130out are not limited to the protruding structure and the polysilicon film.

According to example embodiments, the upper inner tenth ring pattern 130in and the upper outer tenth ring pattern 130out may each include a metal film such as W. According to example embodiments, the upper inner tenth ring pattern 130in and the upper outer tenth ring pattern 130out may extend through the interlayer dielectric 160, and accordingly, top surfaces of the upper inner tenth ring pattern 130in and the upper outer tenth ring pattern 130out may be exposed by the interlayer dielectric 160. According to example embodiments, the upper inner tenth ring pattern 130in and the upper outer tenth ring pattern 130out may each have a structure covered by the interlayer dielectric 160. According to example embodiments, the inner tenth ring pattern RP10in and the outer tenth ring pattern RP10out may each have a ring pattern structure including three or more layers. In such a structure, an uppermost ring pattern may be covered by the interlayer dielectric 160 or may extend through the interlayer dielectric 160 to have a top surface exposed by the interlayer dielectric 160.

In the TSV key OTK10 of the present example embodiment, the first TSV 110 may be the inner measurement point IMP, and a middle portion, e.g., a midline, between the inner tenth ring pattern RP10in and the outer tenth ring pattern RP10out may be an outer measurement point OMP4. More specifically, a rectangular portion along a dash-double dotted line surrounding the first TSV 110 may correspond to the inner measurement point IMP, and a rectangular portion along a dash-double dotted line marked in the middle portion between the inner tenth ring pattern RP10in and the outer tenth ring pattern RP10out may correspond to the outer measurement point OMP4.

As described above, the inner tenth ring pattern RP10in and the outer tenth ring pattern RP10out may constitute the tenth ring pattern RP10. In addition, a portion between the inner tenth ring pattern RP10in and the outer tenth ring pattern RP10out may be the outer measurement point OMP4, and the outer tenth ring pattern RP10out may function to prevent noise signals. According to example embodiments, the outer tenth ring pattern RP10out may be omitted.

In the TSV key OTK10 of the present example embodiment, assuming that the outer tenth ring pattern RP10out is included, the first diameter D1 is 4 μm, the first interval S1 is 2.175 μm, and the second width W2 is 1 μm, the total size TKS of the TSV key OTK10 may be about 16.69 μm. When the outer tenth ring pattern RP10out is excluded, a dummy-excluded size DES3 of the TSV key OTK10 may be about 14.69 μm. In addition, the width ACTS of the active layer arranged inside the inner tenth ring pattern RP10in to surround the first TSV 110 may be about 8.35 μm. However, the total size TKS of the TSV key OTK10, the dummy-excluded size DES3 of the TSV key OTK10, and the width ACTS of the active layer are not respectively limited to the numerical values set forth above.

Figure 13:
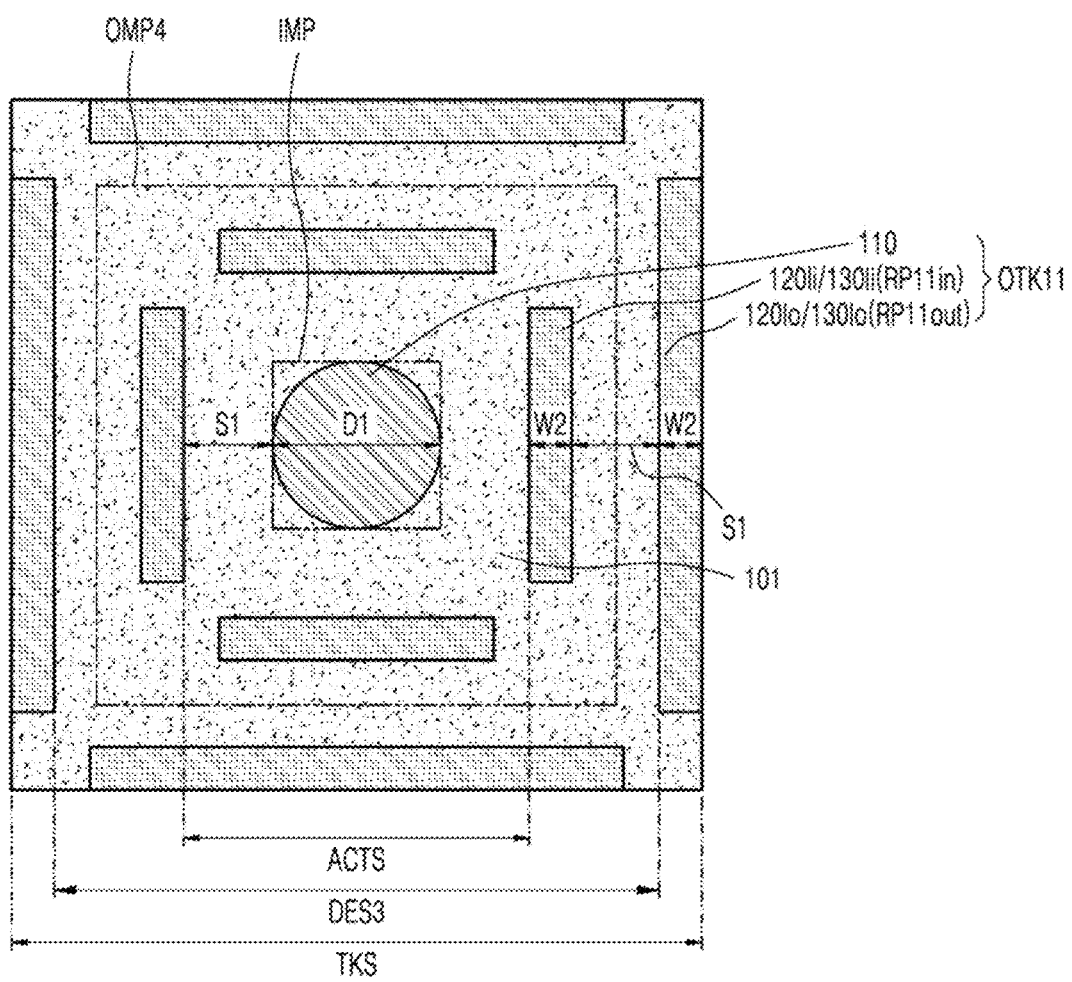

Referring to FIG. 13, a TSV key OTK11 of the present example embodiment may be different from the TSV key OTK10 of FIG. 12A, in terms of a structure of an eleventh ring pattern RP11. More specifically, the TSV key OTK11 of the present example embodiment may include the first TSV 110, an inner eleventh ring pattern RP11in, and an outer eleventh ring pattern RP11out. In addition, as shown in FIG. 13, each of the inner eleventh ring pattern RP11in and the outer eleventh ring pattern RP11out may have a structure in which straight line-shaped line patterns are arranged apart from each other and collectively constitute a rectangular ring shape. For example, the line patterns constituting the inner eleventh ring pattern RP11in may be arranged apart from the first TSV 110 by the first interval S1. In addition, the line patterns constituting the outer eleventh ring pattern RP11out may be arranged apart from the corresponding line patterns constituting the inner eleventh ring pattern RP11in by the first interval S1, while surrounding the inner eleventh ring pattern RP11in. The first interval S1 may be 2 μm or more. The line patterns constituting each of the inner eleventh ring pattern RP11in and the outer eleventh ring pattern RP11out may each have a second width W2. In the TSV key OTK11 of the present example embodiment, the first interval S1 may be 2.175 μm, and the second width W2 may be about 1 μm. However, the first interval S1 and the second width W2 are not limited to the numerical values set forth above.

Each of the line patterns constituting the eleventh ring pattern RP11 may include an oxide film, a nitride film, an oxynitride film, a polysilicon film, or a metal film such as W. The material of each of the line patterns constituting the eleventh ring pattern RP11 is not limited to the materials set forth above. Each of the line patterns constituting the eleventh ring pattern RP11 may include a single layer or multiple layers.

The eleventh ring pattern RP11 of the TSV key OTK11 of the present example embodiment may have a structure covered by the interlayer dielectric 160. However, according to example embodiments, the eleventh ring pattern RP11 may extend through the interlayer dielectric 160. Accordingly, a top surface of the eleventh ring pattern RP11, that is, top surfaces of the line patterns, may be exposed by the interlayer dielectric 160.

In addition, descriptions regarding an inserted or protruding structure of the eleventh ring pattern RP11, inner and outer measurement points in the TSV key OTK11, the total size and dummy-excluded size of the TSV key OTK11, and the like are the same as described regarding the TSV key OTK10 of FIG. 12A.

Figure 14A:
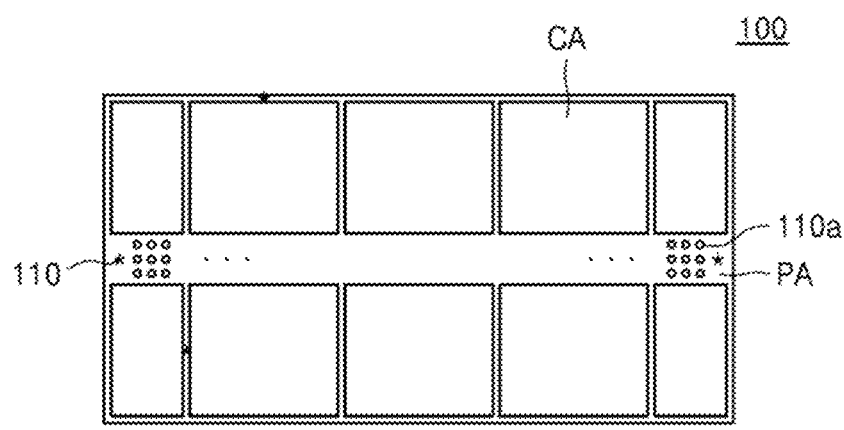
FIGS. 14A and 14B are respectively a plan view and a partial cross-sectional view of a semiconductor device including a TSV key for overlay measurement, according to an example embodiment.
Figure 14B:
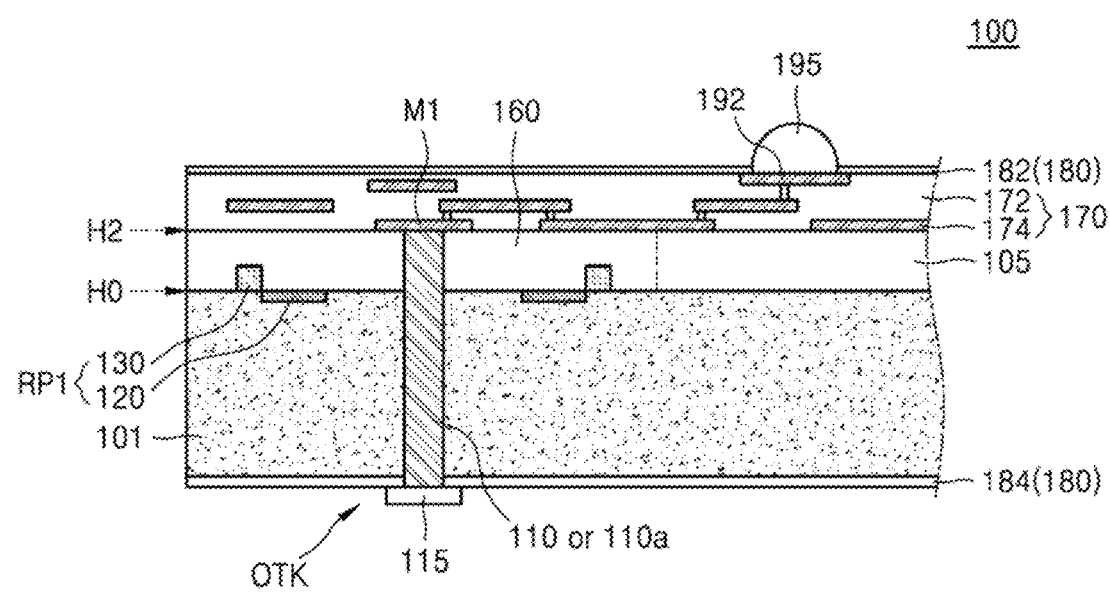

FIGS. 14A and 14B are respectively a plan view and a partial cross-sectional view of a semiconductor device including a TSV key, according to an example embodiment. The descriptions given already with reference to FIGS. 1A to 13 are briefly given or omitted.

Referring to FIGS. 14A and 14B, a semiconductor device 100 including a TSV key (which is simply referred to as "semiconductor device" hereinafter), according to the present example embodiment, may include a cell area CA and a peripheral area PA. Various memory devices may be arranged in the cell area CA. For example, various memory devices such as flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM), and resistive random access memory (RRAM) may be arranged in the cell area CA.

A peripheral circuit for operations of memory cells and/or a core circuit for calculations and the like may be arranged in the peripheral area PA. All the remaining areas except the cell area CA may refer to the peripheral area PA. However, according to example embodiments, the peripheral area PA may be divided into a peripheral circuit area, in which peripheral circuits are arranged, and a core circuit area, in which a core circuit is arranged. In addition, generally, the peripheral circuit area may be arranged in an outer portion or a central portion of a chip, and the core circuit area may be arranged between the cell areas CA. Hereinafter, the peripheral circuit area and the core circuit area will be collectively referred to as the peripheral area PA without distinction therebetween.

The semiconductor device 100 of the present example embodiment may include a plurality of TSVs 110 and 110a in the peripheral area PA. The TSVs 110 and 110a may include a first TSV 110, which is included in the TSV key, and a second TSV 110a actually operating as a through-electrode. The first TSV 110, together with a ring pattern, may be used for an overlay measurement of a TSV, as described regarding the TSV key OTK1 of FIG. 1A. In FIG. 14A, as denoted by *, the first TSV 110 may be arranged in an arbitrary region of the peripheral area PA. Accordingly, the first TSV 110 may be arranged in the peripheral area PA in the central portion of the chip, in the peripheral area PA between the cell areas CA, in the peripheral area PA in an outermost portion of the chip, or the like. On the other hand, the second TSV 110a may be arranged in a two-dimensional array structure in the peripheral area PA in the central portion of the chip. However, the arrangement location of the second TSV 110a is not limited to the peripheral area PA in the central portion of the chip.

The semiconductor device 100 of the present example embodiment may include the substrate 101, an integrated circuit layer 105, a multi-wiring layer 170, a protective insulating layer 180, an external connection terminal 195, and a TSV key OTK. Descriptions regarding the substrate 101 are the same as those regarding the TSV key OTK1 of FIG. 1A. Various memory devices may be arranged in the integrated circuit layer 105. For example, the semiconductor device 100 of the present example embodiment may be a DRAM memory device, and a plurality of DRAMs may be arranged in the integrated circuit layer 105. The multi-wiring layer 170 may include an interlayer dielectric 172 and a wiring line 174. The protective insulating layer 180 may include an upper protective insulating layer 182 and a lower protective insulating layer 184. The external connection terminal 195 may be arranged on a pad 192 connected to the wiring line 174. The external connection terminal 195 may include both a pillar and a solder or include only a solder.

The TSV key OTK may include a TSV 110 or 110a and a first ring pattern RP1. The TSV 110 or 110a may extend through the substrate 101. The TSV 110 or 110a may be the first TSV 110 or the second TSV 110a. In other words, the TSV key OTK may be implemented by intentionally forming the first TSV 110, which is not operated, and the ring pattern RP1, or may be implemented by forming only the first ring pattern RP1 around the second TSV 110a that is an operating TSV. One end of the TSV 110 or 110a may be connected to a wiring line 171, e.g., an M1 wiring line, and the other end may be connected to a lower pad 115. According to example embodiments, when the TSV 110 or 110a is the first TSV 110, the lower pad 115 may be omitted, and the TSV 110 or 110*a* may not be connected to the M1 wiring line. Descriptions regarding the first ring pattern RP1 are the same as those regarding the TSV key OTK1 of FIG. 1A. In addition, the TSV key OTK may include the second to eleventh ring patterns RP2 to RP11 of the TSV keys OTK2 to OTK11 in FIGS. 4A to 13B, instead of the first ring pattern RP1.

As described above, the first TSV 110 may be formed together with the second TSV 110*a* that is an operating TSV. Accordingly, the first TSV 110 may be substantially the same as the second TSV 110*a* in terms of a structure, a size, a material, and the like. However, according to example embodiments, the first TSV 110 may be formed separately from the second TSV 110*a*, and thus, the first TSV 110 may be different from the second TSV 110*a* in terms of at least one of a structure, a size, and a material. More specifically, a recent trend is that the size of the second TSV 110*a* is increasingly ultra-finer, and when the first TSV 110 is formed to have the same structure and size as those of the second TSV 110*a*, the first TSV 110 may not function as a TSV key. Accordingly, in an example embodiment, the first TSV 110 may be formed to a size that is set separately from the second TSV 110*a*. As a particular example, even when the diameter of the second TSV 110*a* is reduced to less than 4 μm, the first TSV 110 may be formed to still have a diameter of 4 μm or more.

Figure 15:
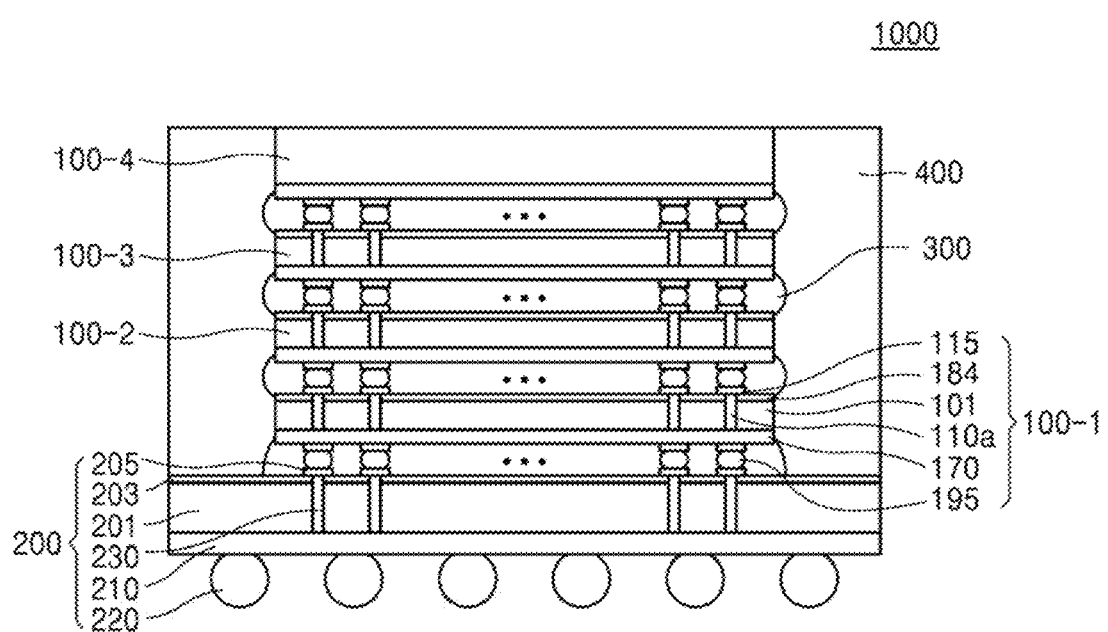
FIG. 15 is a cross-sectional view of a semiconductor package including a TSV key for overlay measurement, according to an example embodiment.

FIG. 15 is a cross-sectional view of a semiconductor package including a TSV key, according to an example embodiment. The descriptions given already with reference to FIGS. 1A to 14B are briefly given or omitted.

Referring to FIG. 15, a semiconductor package 1000 of the present example embodiment may include a base chip 200, four semiconductor chips 100-1 to 100-4 on the base chip 200, and a sealant 400.

The base chip 200 may be formed based on a semiconductor material such as a silicon (Si) wafer. However, according to example embodiments, the base chip 200 may include a printed circuit board (PCB), a glass substrate, or the like, which does not include a semiconductor material. Hereinafter, the base chip 200 that is based on a semiconductor material will be mainly described. The base chip 200 may include a substrate 201, an upper protective layer 203, an upper pad 205, a device layer 210, and an external connection terminal 220. However, when the base chip 200 includes a PCB, a glass substrate, or the like not including a semiconductor material, the base chip 200 may not include the device layer 210.

In the semiconductor package 1000 of the present example embodiment, the base chip 200 may be, e.g., an interface chip including a plurality of logic devices and/or a plurality of memory devices in the device layer 210. Accordingly, the base chip 200 may transfer signals from the four semiconductor chips 100-1 to 100-4, which are stacked on the base chip 200, to the outside thereof and may transfer a signal and power from the outside thereof to the four semiconductor chips 100-1 to 100-4. The base chip 200 may perform both a logic function and a memory function through the logic devices and the memory devices. However, according to example embodiments, the base chip 200 may include only the logic devices and thus perform only a logic function.

In the semiconductor package 1000 of the present example embodiment, the base chip 200 may include a second TSV 230. Accordingly, the base chip 200 may include a TSV key, and a first TSV 110 of the TSV key may be formed in the base chip 200. However, in FIG. 15, only the second TSV 230 corresponding to an operating TSV is illustrated for convenience.

Each of the four semiconductor chips 100-1 to 100-4 may be the semiconductor device 100 of FIG. 14A. The four semiconductor chips 100-1 to 100-4 may be stacked on the base chip 200 or a corresponding underlying semiconductor chip via an adhesive film 300 and the external connection terminal 195. A fourth semiconductor chip 100-4 at an uppermost location from among the four semiconductor chips 100-1 to 100-4 may not include the second TSV 110*a*. Accordingly, only the three semiconductor chips 100-1 to 100-3 may include the TSV key OTK1 including the first TSV 110 and the first ring pattern RP1. In addition, although the three semiconductor chips 100-1 to 100-3 include both the first TSV 110 and the second TSV 110*a*, only the second TSV 110*a* is illustrated for convenience.

In the semiconductor package 1000 of the present example embodiment, although the four semiconductor chips 100-1 to 100-4 are stacked on the base chip 200, the number of semiconductor chips stacked on the base chip 200 is not limited to four. For example, one to three or five or more semiconductor chips may be stacked on the base chip 200. In the semiconductor package 1000 of the present example embodiment, the base chip 200 may be an interface chip, and each of the four semiconductor chips 100-1 to 100-4 may be a DRAM chip. Accordingly, the semiconductor package 1000 of the present example embodiment may be a high bandwidth memory (HBM) package.

Figure 16A:
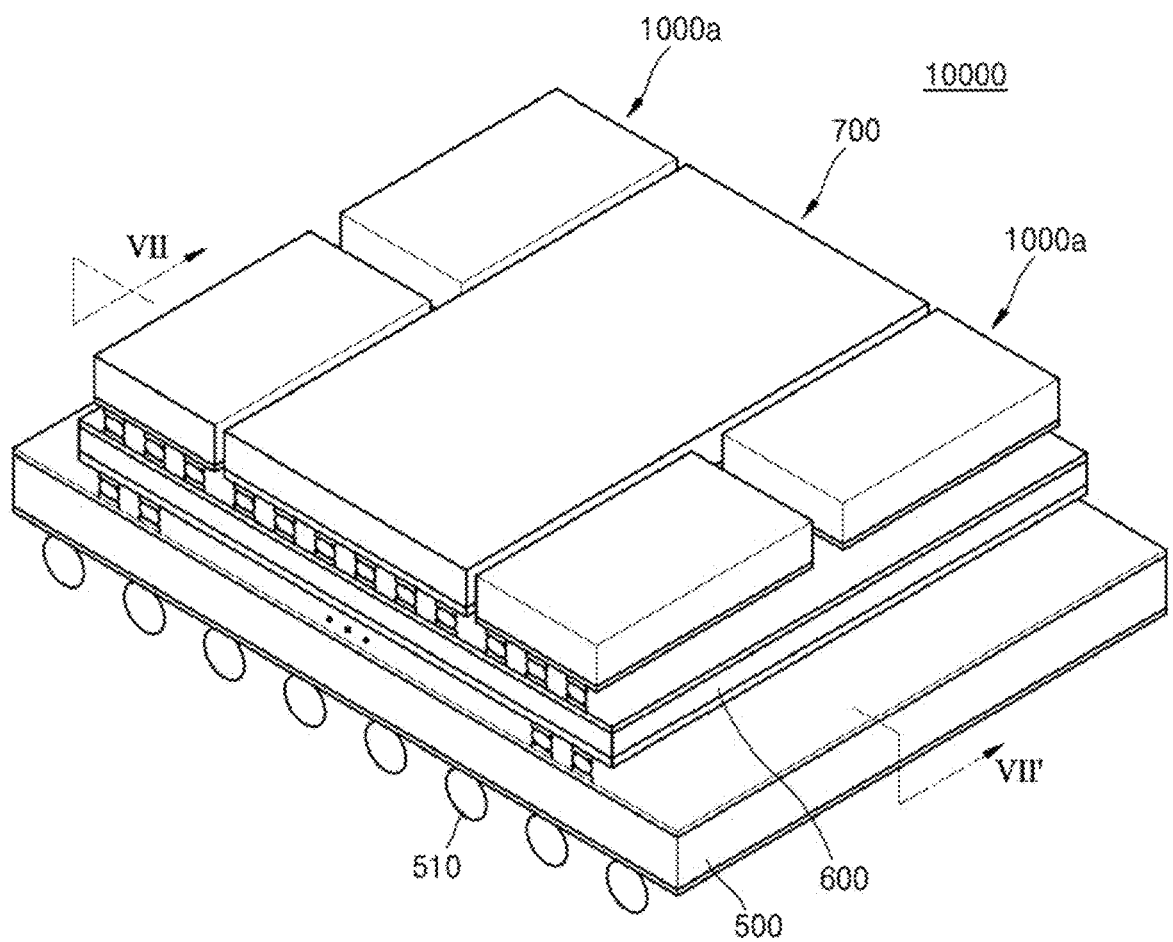
FIGS. 16A and 16B are respectively a perspective view and a cross-sectional view of a semiconductor device including a semiconductor package including a TSV key for overlay measurement, according to an example embodiment.
Figure 16B:
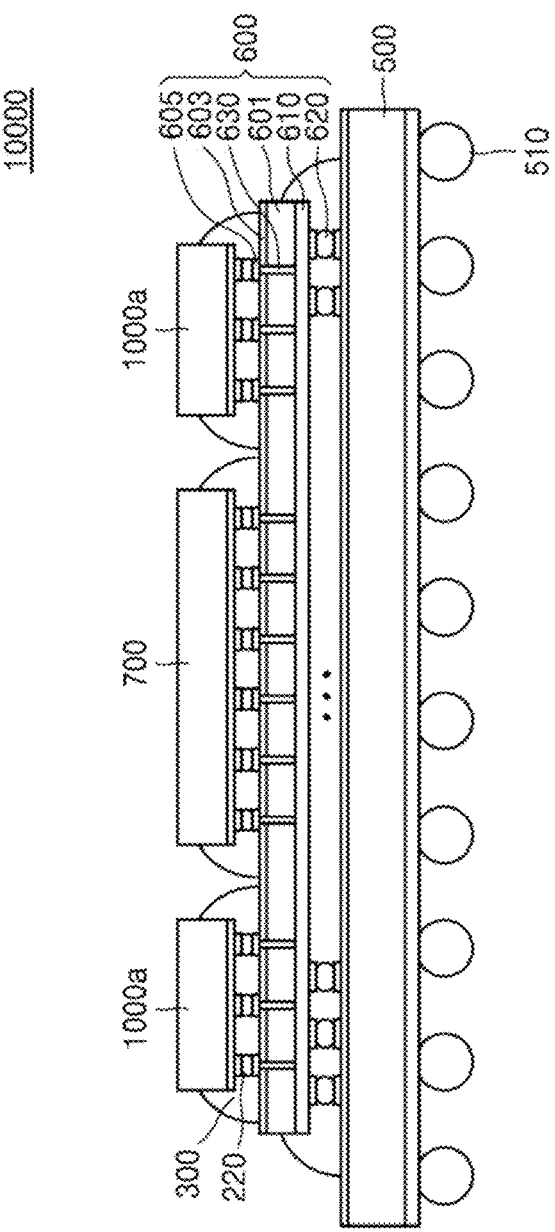

FIGS. 16A and 16B are respectively a perspective view and a cross-sectional view of a semiconductor device including a semiconductor package including a TSV key, according to an example embodiment. FIG. 16B is a cross-sectional view taken along a line VII-VII' of FIG. 16A. The descriptions given already with reference to FIG. 15 are briefly given or omitted.

Referring to FIGS. 16A and 16B, a semiconductor device 10000 of the present example embodiment may include a semiconductor package 1000*a*, an interposer 600, a processor chip 700, and a package substrate 500.

The semiconductor package 1000*a* may be the semiconductor package 1000 of FIG. 15. Accordingly, the semiconductor package 1000*a* may include the base chip 200 and the four semiconductor chips 100-1 to 100-4, and the base chip 200 and the three semiconductor chips 100-1 to 100-3 may each include the TSV key OTK1 including the first TSV 110 and the first ring pattern RP1.

In the semiconductor device 10000 of the present example embodiment, four semiconductor packages 1000*a* may be stacked on the interposer 600 by using the external connection terminal 220 and the adhesive film 300. However, the number of semiconductor packages 1000*a* stacked on the interposer 600 is not limited to four. For example, one to three or five or more semiconductor packages 1000*a* may be stacked on the interposer 600.

The interposer 600 may include a substrate 601, an upper protective layer 603, an upper pad 605, a wiring layer 610, a bump 620, and a through-electrode 630. The semiconductor package 1000*a* and the processor chip 700 may be stacked on the package substrate 500 via the medium of the interposer 600. The interposer 600 may electrically connect both the semiconductor package 1000*a* and the processor chip 700 to the package substrate 500.

The substrate 601 may include, e.g., one of silicon, organic, plastic, and glass substrates. However, the material of the substrate 601 is not limited to the materials set forth above. When the substrate 601 is a silicon substrate, the interposer 600 may be referred to as a silicon interposer. In addition, when the substrate 601 is an organic substrate, the interposer 600 may be referred to as a panel interposer.

The through-electrode 630 may extend from a top surface to a bottom surface of the substrate 601 and thus penetrate the substrate 601. In addition, the through-electrode 630 may extend into the wiring layer 610 and thus be electrically connected to wiring lines of the wiring layer 610. When the substrate 601 includes silicon, the through-electrode 630 may be referred to as a TSV. According to example embodiments, the interposer 600 may include only a wiring layer therein and may not include a through-electrode.

In the semiconductor device 10000 of the present example embodiment, the interposer 600 may be used to convert or transfer electrical signals input thereto, between the package substrate 500 and the semiconductor package 1000a or the processor chip 700. Accordingly, the interposer 600 may not include elements such as active elements or passive elements.

The processor chip 700 may be a GPU/CPU/SOC chip. According to types of devices included in the processor chip 700, the semiconductor device 10000 may be divided into server-aimed semiconductor devices, mobile-aimed semiconductor devices, and the like.

Although not shown, the semiconductor device 10000 may include an inner sealant covering side surfaces and top surfaces of the semiconductor package 1000a and the processor chip 700 on the interposer 600. In addition, the semiconductor device 10000 may include an outer sealant covering the interposer 600 and the inner sealant on the package substrate 500. According to example embodiments, the inner sealant and the outer sealant may be formed together and thus may not be distinguished from each other. In addition, according to example embodiments, the inner sealant may cover only the top surface of the processor chip 700 and may not cover the top surface of the semiconductor package 1000a.

An external connection terminal 510 such as a solder ball may be arranged under the package substrate 500. Accordingly, the semiconductor device 10000 may be mounted on another external board such as a system board or a mother board via the external connection terminal 510.

For reference, a structure of the semiconductor device 10000 according to the present example embodiment is referred to as a 2.5D package structure, and the 2.5D package structure may be a relative concept with respect to a 3D package structure in which all semiconductor chips are stacked together and there is no interposer. Both the 2.5D package structure and the 3D package structure may be included in a system-in-package (SIP) structure. The semiconductor device 10000 of the present example embodiment may also be a type of semiconductor package. However, because the semiconductor device 10000 includes the semiconductor package 1000a such as the semiconductor package 1000 of FIG. 15, the term "semiconductor device" is given to the semiconductor device 10000 to make a terminological distinction between the semiconductor device 10000 and the semiconductor package 1000a. Hereinafter, the same concept may also be applied to a semiconductor device 10000a of FIG. 17.

Figure 17:
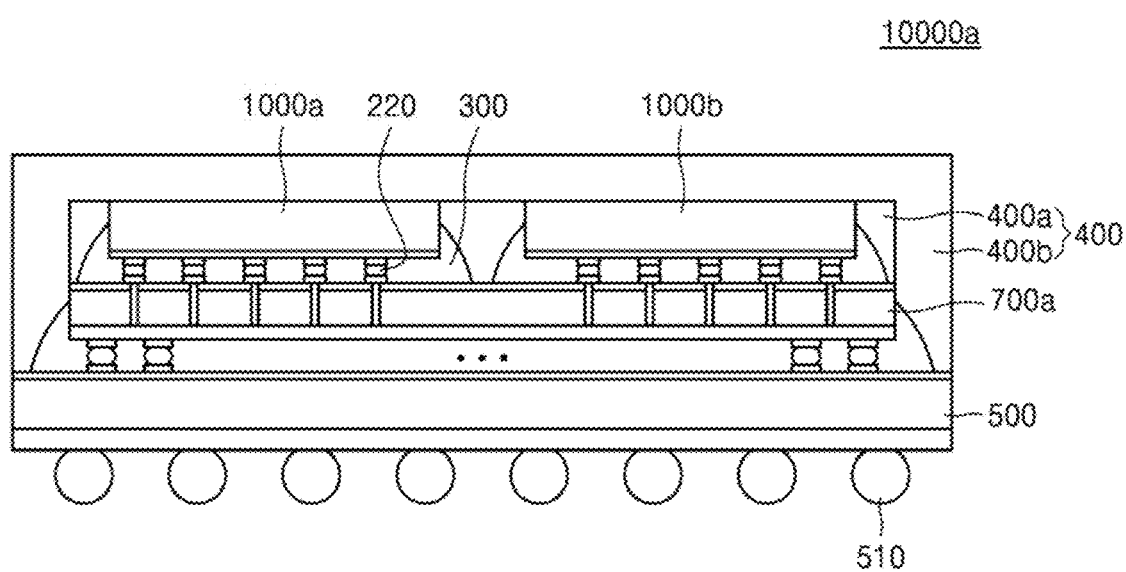
FIG. 17 is a cross-sectional view of a semiconductor device including a semiconductor package including a TSV key for overlay measurement, according to an example embodiment.

FIG. 17 is a cross-sectional view of a semiconductor device including a semiconductor package including a TSV key, according to an example embodiment. The descriptions given already with reference to FIG. 15 are briefly given or omitted.

Referring to FIG. 17, a semiconductor device 10000a of the present example embodiment may include semiconductor packages 1000a and 1000b, a logic chip 700a, the package substrate 500, and the sealant 400.

The two semiconductor packages 1000a and 1000b may be stacked on the logic chip 700a by using the external connection terminal 220 and the adhesive film 300. The two semiconductor packages 1000a and 1000b may be the same semiconductor package. For example, each of the two semiconductor packages 1000a and 1000b may be the semiconductor package 1000 of FIG. 15. Accordingly, each of the two semiconductor packages 1000a and 1000b may include the base chip 200 and the four semiconductor chips 100-1 to 100-4, and the base chip 200 and the three semiconductor chips 100-1 to 100-3 may each include the TSV key OTK1 including the first TSV 110 and the first ring pattern RP1. According to example embodiments, the two semiconductor packages 1000a and 1000b may be different semiconductor packages from each other. For example, one of the two semiconductor packages 1000a and 1000b may be a semiconductor package including another type of memory chip such as an SRAM chip other than a DRAM chip.

The logic chip 700a may be mounted on the package substrate 500. The logic chip 700a may include various types of processor chips such as GPU/CPU/SOC chips. The sealant 400 may include an inner sealant 400a and an outer sealant 400b. The inner sealant 400a may cover the semiconductor packages 1000a and 1000b on the logic chip 700a. In addition, the outer sealant 400b may cover the logic chip 700a on the package substrate 500, the semiconductor packages 1000a and 1000b, and the inner sealant 400a. The external connection terminal 510 such as a solder ball may be arranged under the package substrate 500. Accordingly, the semiconductor device 10000a may be mounted on another external board such as a system board or a mother board via the external connection terminal 510. In the semiconductor device 10000a of the present example embodiment, because the logic chip 700a is arranged on the package substrate 500 and the semiconductor packages 1000a and 1000b are stacked on the logic chip 700a, the semiconductor device 10000a may correspond to a 3D package structure.

By way of summation and review, semiconductor devices including TSVs may be used in semiconductor packages, and overlay measurement may be performed between TSVs and lower layers in such semiconductor devices.

As described above, example embodiments may provide a through-silicon via (TSV) key for overlay measurement, which allows an overlay of a TSV to be accurately measured, and a semiconductor device including the TSV key.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A through-silicon via (TSV) key for overlay measurement, the TSV key comprising:
 a first TSV extending through at least a portion of a substrate in a first direction that is perpendicular to a top surface of the substrate; and at least one ring pattern, which is spaced apart from and surrounds the first TSV in a second direction that is parallel to the top surface of the substrate, the at least one ring pattern being arranged in a layer that is lower than a top surface of the first TSV in the first direction, wherein an inner measurement point corresponds to the first TSV, an outer measurement point corresponds to the at least one ring pattern, and the inner measurement point and the outer measurement point are arranged to provide an overlay measurement of a TSV, and wherein the first TSV is not electrically operated and the at least one ring pattern is an insulating film.

2. The TSV key as claimed in claim 1, wherein:
a horizontal cross-section of the first TSV, which is perpendicular to the first direction, has a circular shape, and
the at least one ring pattern has a shape of a circular ring, an elliptical ring, or a polygonal ring, which surrounds the first TSV.

3. The TSV key as claimed in claim 1, wherein the inner measurement point corresponds to an outer portion of the first TSV and the outer measurement point corresponds to at least one of an inner portion, a middle portion and an outer portion of the at least one ring pattern.

4. The TSV key as claimed in claim 2, wherein:
the at least one ring pattern includes two ring patterns arranged apart from or in contact with each other in the second direction,
an outer portion of the first TSV corresponds to the inner measurement point,
when the two ring patterns are arranged apart from each other, a portion between the two ring patterns corresponds to the outer measurement point, and
when the two ring patterns are arranged in contact with each other, an inner ring pattern closest to the first TSV corresponds to the outer measurement point.

5. The TSV key as claimed in claim 1, wherein:
the at least one ring pattern has a shape in which a plurality of fine patterns surround the first TSV, and
the plurality of fine patterns constitute a one-ply ring pattern line or a two or more-ply ring pattern line.

6. The TSV key as claimed in claim 1, wherein:
the at least one ring pattern has a shape in which a plurality of lines surround the first TSV, and
the plurality of lines constitute a one-ply ring pattern line or a two or more-ply ring pattern line.

7. The TSV key as claimed in claim 1, wherein:
a horizontal cross-section of the first TSV, which is perpendicular to the first direction, has a circular shape, and
a diameter of the circular shape is less than 7 μm.

8. The TSV key as claimed in claim 1, wherein a distance between the first TSV and the at least one ring pattern in the second direction is equal to or greater than 2 μm.

9. The TSV key as claimed in claim 1, wherein the at least one ring pattern includes at least one of a polysilicon film, an oxide film, a nitride film, and an oxynitride film.

10. The TSV key as claimed in claim 1, wherein:
the at least one ring pattern includes one ring pattern including a single layer or multiple layers, and
the at least one ring pattern includes at least one of a polysilicon film, an oxide film, a nitride film, and an oxynitride film.

11. The TSV key as claimed in claim 1, wherein:
the at least one ring pattern includes two ring patterns arranged in contact with each other in the second direction, an inner ring pattern closest to the first TSV, out of the two ring patterns, includes an oxide film,
an outer ring pattern contacting the inner ring pattern, out of the two ring patterns, includes a metal film or a polysilicon film, and
the inner ring pattern corresponds to the outer measurement point.

12. The TSV key as claimed in claim 1, wherein:
the at least one ring pattern includes two ring patterns arranged apart from each other in the second direction,
each of the two ring patterns includes a single layer or multiple layers, and includes at least one of a metal film, a polysilicon film, an oxide film, a nitride film, and an oxynitride film, and
a location between the two ring patterns corresponds to the outer measurement point.

13. The TSV key as claimed in claim 1, wherein:
the TSV key is formed in a chip, and
the chip includes the substrate and a plurality of second TSVs that penetrate at least a portion of the substrate and are electrically operated.

14. The TSV key as claimed in claim 13, wherein the first TSV is larger in plan area than each second TSV of the plurality of second TSVs.

15. A semiconductor device, comprising:
a substrate;
an integrated circuit layer in the substrate;
a multi-wiring layer on the integrated circuit layer;
a through-silicon via (TSV) key configured for overlay measurement, the TSV key including:
a first TSV extending through at least a portion of the substrate in a first direction that is perpendicular to a top surface of the substrate, and
at least one ring pattern, which is spaced apart from and surrounds the first TSV in a second direction that is parallel to the top surface of the substrate, the at least one ring pattern being arranged in a layer that is lower than a top surface of the first TSV in the first direction; and
a plurality of second TSVs extending through at least a portion of the substrate in the first direction,
wherein an inner measurement point corresponds to the first TSV, an outer measurement point corresponds to the at least one ring pattern, and the inner measurement point and the outer measurement point are arranged to provide an overlay measurement of a TSV, and
wherein the first TSV is not electrically operated and the at least one ring pattern is an insulating film.

16. The semiconductor device as claimed in claim 15, wherein:
a horizontal cross-section of the first TSV, which is perpendicular to the first direction, has a circular shape, and
the at least one ring pattern has a shape of a circular ring, an elliptical ring, or a polygonal ring, which surrounds the first TSV.

17. The semiconductor device as claimed in claim 15, wherein:
the at least one ring pattern includes one ring pattern or two ring patterns, and
when the at least one ring pattern includes the two ring patterns, the two ring patterns are arranged apart from or in contact with each other in the second direction.

18. The semiconductor device as claimed in claim 15, wherein:
  the at least one ring pattern has a shape in which a plurality of fine patterns or a plurality of lines surround the first TSV, and
  the plurality of fine patterns or the plurality of lines constitute a one-ply ring pattern line or a two or more-ply ring pattern line.

19. The semiconductor device as claimed in claim 15, wherein:
  a horizontal cross-section of the first TSV, which is perpendicular to the first direction, has a circular shape,
  a diameter of the circular shape is less than 7 µm, and
  a distance between the first TSV and the at least one ring pattern in the second direction is equal to or greater than 2 µm.

20. A semiconductor package, comprising:
  a package substrate; and
  at least one semiconductor chip stacked on the package substrate, the at least one semiconductor chip including:
    a semiconductor substrate;
    an integrated circuit layer in the semiconductor substrate;
    a multi-wiring layer on the integrated circuit layer;
    a through-silicon via (TSV) key configured for overlay measurement, the TSV key including:
      a first TSV extending through at least a portion of the semiconductor substrate in a first direction that is perpendicular to a top surface of the semiconductor substrate, and
      at least one ring pattern that is spaced apart from and surrounds the first TSV in a second direction that is parallel to the top surface of the semiconductor substrate, the at least one ring pattern being arranged in a lower layer than a top surface of the first TSV in the first direction; and
    a plurality of second TSVs extending through at least a portion of the semiconductor substrate in the first direction,
    wherein an inner measurement point corresponds to the first TSV, an outer measurement point corresponds to the at least one ring pattern, and the inner measurement point and the outer measurement point are arranged to provide an overlay measurement of a TSV, and
    wherein the first TSV is not electrically operated and the at least one ring pattern is an insulating film.

\* \* \* \* \*